(12) United States Patent
Kawai

(10) Patent No.: US 6,750,481 B2
(45) Date of Patent: Jun. 15, 2004

(54) SEMICONDUCTOR LAMINATED SUBSTRATE, SEMICONDUCTOR CRYSTAL SUBSTRATE AND SEMICONDUCTOR DEVICE AND METHOD OF MANUFACTURING THE SAME

(75) Inventor: Hiroji Kawai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/098,322

(22) Filed: Mar. 15, 2002

(65) Prior Publication Data

US 2002/0088979 A1 Jul. 11, 2002

Related U.S. Application Data

(62) Division of application No. 09/482,905, filed on Jan. 14, 2000, now Pat. No. 6,426,264.

(30) Foreign Application Priority Data

Jul. 23, 1999 (JP) .......................... P11-209202

(51) Int. Cl.[7] .......................................... H01L 31/0328
(52) U.S. Cl. ........................ 257/183; 257/618; 257/622
(58) Field of Search .................. 257/94, 183, 200, 257/201, 618, 622, 773, 782; 438/39, 42, 46, 47, 29, 481

(56) References Cited

U.S. PATENT DOCUMENTS

| | | | | |
|---|---|---|---|---|
| 4,339,870 A | * | 7/1982 | Ball et al. | ................... 438/403 |
| 4,818,724 A | * | 4/1989 | Cetronio et al. | ............ 438/606 |
| 5,453,405 A | * | 9/1995 | Fan et al. | ..................... 438/34 |
| 5,459,081 A | * | 10/1995 | Kajita | .......................... 438/25 |
| 5,665,607 A | * | 9/1997 | Kawama et al. | ............... 438/64 |
| 6,177,359 B1 | * | 1/2001 | Chen et al. | .................. 438/751 |
| 6,448,109 B1 | * | 9/2002 | Karpman | .................... 438/108 |

FOREIGN PATENT DOCUMENTS

| | | |
|---|---|---|
| JP | 7-165498 | 6/1995 |
| JP | 10-178202 | 6/1998 |
| JP | 11-35397 | 2/1999 |

OTHER PUBLICATIONS

Kato et al., "Selective Growth of Wurtzite GaN and $Al_xGa_{1-x}N$ on GaN/sapphire Substrates by Metalorganic Vapor Phase Epitaxy," J. Crystal Growth, 1994, pp. 133–140, vol. 144 (abstract only).

Mileham et al., "Wet Chemical Etching of AlN," Appl. Phys. Lett., 1995, pp. 1119–1121, vol. 67.

* cited by examiner

Primary Examiner—Tuan H. Nguyen
(74) Attorney, Agent, or Firm—Sonnenschein, Nath & Rosenthal LLP

(57) ABSTRACT

A semiconductor crystal layer composed of GaN is grown on a base substrate composed of sapphire sandwiching a separating layer composed of AlN and a buffer layer composed of GaN. The separating layers and the buffer layers are distributed in the form of lines, and a flow-through hole for an etchant is formed in the side of these layers sandwiching an anti-growing film composed of $SiO_2$. Thus, the etchant flows through the flow-through hole, the anti-growing film and the separating layer are etched, and the base substrate is easily isolated.

20 Claims, 12 Drawing Sheets

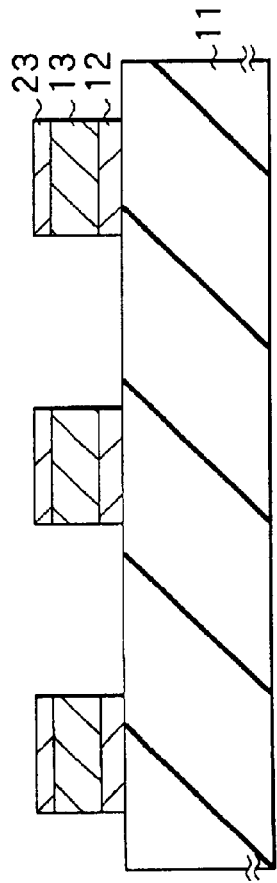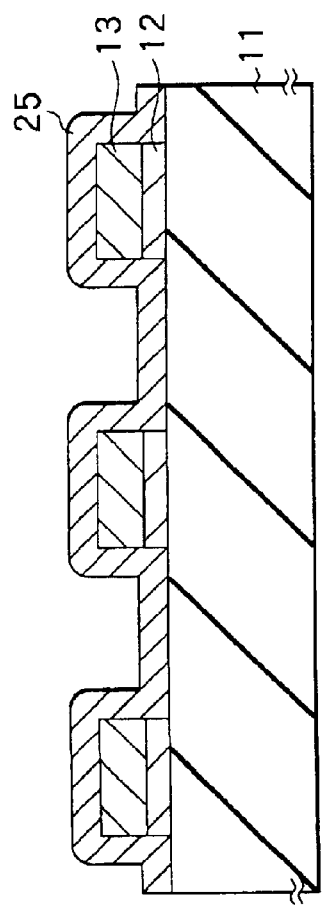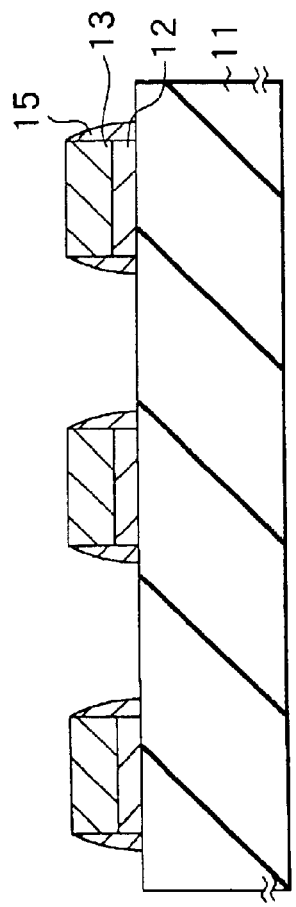

SEMICONDUCTOR LAMINATED SUBSTRATE, SEMICONDUCTOR CRYSTAL SUBSTRATE AND SEMICONDUCTOR DEVICE AND METHOD OF MANUFACTURING THE SAME

RELATED APPLICATION DATA

This application claims priority to Japanese Application No. P11-209202, filed Jul. 23, 1999, and is a divisional of U.S. application Ser. No. 09/482,905, filed Jan. 14, 2000 now U.S. Pat. No. 6,426,264, each of which is incorporated herein by reference to the extent permitted by law.

BACKGROUND OF THE INVENTION

1. Field of the Invention

The invention relates to a semiconductor laminated substrate having a base substrate and a semiconductor crystal layer formed on the base substrate sandwiching a separating layer, a semiconductor crystal substrate having a pair of facing surfaces and a semiconductor device comprising the semiconductor laminated substrate and the semiconductor crystal substrate and a method of manufacturing the same.

2. Description of the Related Art

A III–V nitride semiconductor composed of gallium nitride (GaN) or the like is a direct gap semiconductor having energy band ranges from 1.9 eV to 6.2 eV, and thus gallium nitride receives attention as a material for constituting an optical element ranging from a visible region to an ultraviolet region. Gallium nitride has about $2.5 \times 10^7$ cm/s by saturation rate and about $5 \times 10^6$ V/cm by breakdown electric field, which are higher than those of any other electronic material. Thus, gallium nitride is considered to have a great potential for the material for constituting an electron transit element for a high frequency and a large power.

However, it is extremely difficult to grow a bulk crystal from a melt because the III–V nitride semiconductor has a high melting point and also a vapor pressure of nitrogen is high near the melting point. Thus, the crystal of the III–V nitride semiconductor is generally obtained by epitaxial growth on a base substrate made of sapphire, silicon carbide, spinel, lithium gallate or the like. However, since such a base substrate has a different lattice constant from the III–V nitride semiconductor, a large amount of lattice defects occur in the crystal of the III–V nitride semiconductor grown on this base substrate.

Therefore, a method of reducing the defects by employing selective growth technology, for example, has been recently used (see Y. Kato, J. Crystal Growth, 144 (1994) 133). This method is, for example, that a mask layer having an opening and composed of silicon dioxide ($SiO_2$), silicon nitride ($Si_3N_4$) or the like is formed on a thin film of the III–V nitride semiconductor grown on the base substrate and then the crystal of the III–V nitride semiconductor is grown through the opening of the mask layer. According to this method, the crystal is transversely grown through the opening of the mask layer, whereby the propagation of the through dislocation is blocked and thus the defects are reduced. This method applies the technology for growing the crystal of gallium arsenide (GaAs) on the substrate made of silicon (Si) and gets great effect on the crystal growth of the III–V nitride semiconductor.

However, although a reduction in the defects is thus attempted, the following problems exist when the base substrate made of sapphire or the like is used. In the case of the base substrate made of sapphire, the following problems occur. First, difficulty in cleavage makes it impossible for the cleavage to form an end surface for the exit of the light with excellent reproducibility for the preparation of a laser or the like. Second, two types of electrodes must be positioned from the same side due to insulating properties. Third, low thermal conductivity results in a temperature rise of an active layer in a light emitting device or a channel layer in the electron transit element, thereby causing deterioration of the device or element. In order to solve these problems, it is therefore preferable that the base substrate is used only for growing the crystal and then the base substrate is removed after the crystal is grown.

Methods of removing the base substrate include a mechanical lapping method and a chemical etching method, for example. The mechanical lapping method is not practical because lapping with-keeping a large area is difficult due to bowing of the base substrate grown the III–V nitride semiconductor. On the other hand, the chemical etching method is preferable because of no mechanical damage. For example, the method, in which the III–V nitride semiconductor is grown on the base substrate through a buffer layer composed of oxide such as zinc oxide (ZnO) or magnesium oxide (MgO) and then the buffer layer is removed by etching, is proposed as the method of isolating the base substrate by the etching (see Unexamined Japanese Patent Application Publication No. 7-165498, No. 10-178202 and No. 11-35397).

However, since in this method, the III–V nitride semiconductor is only grown through the buffer layer composed of oxide, the base substrate cannot be isolated for the following reasons. First, if the buffer layer composed of oxide is as thin as tens of nanometers, the buffer layer disappears at the time of the growth of the III–V nitride semiconductor and thus the presence of the buffer layer cannot be confirmed. Secondly, even if the buffer layer remains in the form of normal oxide, the III–V nitride semiconductor is precipitated on the sides on the periphery of the base substrate and thus the buffer layer is coated with the III–V nitride semiconductor. Consequently, an etchant cannot be brought into contact with the buffer layer and thus the buffer layer cannot be etched. Thirdly, even if the etchant is in contact with the buffer layer, an ordinary etching speed is about a few micrometers per minute and viscosity resulting from a dissolved component increases in accordance with the etching. Consequently, an enormous time is required to impregnate the etchant into near the center of the base substrate of 2 inches diameter, for example. In ID fact, the etching stops after reaching up to about hundreds of micrometers, and thus it is difficult to isolate the base substrate.

The invention is designed to overcome the foregoing problems. It is an object of the invention to provide a semiconductor laminated substrate and a semiconductor device capable of easily isolating a base substrate by etching and a method of manufacturing the same, and a semiconductor crystal substrate and a semiconductor device obtained by the method and a method of manufacturing the same.

SUMMARY OF THE INVENTION

A semiconductor laminated substrate of the invention having a base substrate and a semiconductor crystal layer formed on the base substrate sandwiching a separating layer comprises a flow-through hole for flowing therethrough an etchant for etching the separating layer.

A semiconductor crystal substrate of the invention having a pair of facing surfaces comprises projections or depressions on one of the facing surfaces.

In a semiconductor device of the invention comprising a semiconductor laminated substrate having a base substrate and a semiconductor crystal layer formed on the base substrate sandwiching a separating layer, the semiconductor laminated substrate has a flow-through hole for flowing therethrough an etchant for etching the separating layer.

In another semiconductor device of the invention comprising a semiconductor crystal substrate having a pair of facing surfaces, the semiconductor crystal substrate has protrusions or depressions on one of the facing surfaces.

A method of manufacturing a semiconductor laminated substrate of the invention having a base substrate and a semiconductor crystal layer formed on the base substrate sandwiching a separating layer comprises the step of forming a flow-through hole for flowing therethrough an etchant for etching the separating layer.

A method of manufacturing a semiconductor crystal substrate of the invention in a semiconductor laminated substrate having a base substrate and a semiconductor crystal layer formed on the base substrate sandwiching a separating layer and having a flow-through hole for flowing therethrough an etchant for etching the separating layer comprises the step of etching the separating layer by flowing the etchant through the flow-through hole, thereby isolating the semiconductor crystal layer from the base substrate.

A method of manufacturing a semiconductor device of the invention uses a semiconductor laminated substrate having a base substrate and a semiconductor crystal layer formed on the base substrate sandwiching a separating layer and having a flow-through hole for flowing therethrough an etchant for etching the separating layer.

Another method of manufacturing a semiconductor device of the invention using a semiconductor laminated substrate having a base substrate and a semiconductor crystal layer formed on the base substrate sandwiching a separating layer and having a flow-through hole for flowing therethrough an etchant for etching the separating layer comprises the step of etching the separating layer by flowing the etchant through the flow-through hole, thereby isolating the base substrate.

Still another method of manufacturing a semiconductor device of the invention in a semiconductor laminated substrate having a base substrate and a semiconductor crystal layer formed on the base substrate sandwiching a separating layer and having a flow-through hole for flowing therethrough an etchant for etching the separating layer uses a semiconductor crystal substrate which is formed by etching the separating layer by flowing the etchant through the flow-through hole and thereby isolating the semiconductor crystal layer from the base substrate.

A further method of manufacturing a semiconductor device of the invention uses a semiconductor crystal substrate having a pair of facing surfaces, one of which has protrusions or depressions.

A semiconductor laminated substrate of the invention has the flow-through hole for flowing therethrough the etchant for etching the separating layer. Thus, the separating layer is easily removed by etching, and therefore the semiconductor crystal layer is easily isolated from the base substrate.

A semiconductor crystal substrate of the invention has the protrusions or the depressions on one of the facing surfaces.

A semiconductor device of the invention comprises the semiconductor laminated substrate of the invention or the semiconductor crystal substrate of the invention.

In a method of manufacturing the semiconductor laminated substrate of the invention, the flow-through hole for flowing therethrough the etchant for etching the separating layer is formed.

In a method of manufacturing the semiconductor crystal substrate of the invention, the separating layer is etched by flowing the etchant through the flow-through hole, whereby the semiconductor crystal layer is isolated from the base substrate.

In a method of manufacturing the semiconductor device of the invention, the semiconductor laminated substrate of the invention is used.

In another method of manufacturing the semiconductor device of the invention, the separating layer is etched by flowing the etchant through the flow-through hole, whereby the base substrate is isolated.

In still another method of manufacturing the semiconductor device of the invention in the semiconductor laminated substrate of the invention, the semiconductor crystal substrate formed by etching the separating layer by flowing the etchant through the flow-through hole and thereby isolating the semiconductor crystal layer from the base substrate, is used.

In a further method of manufacturing the semiconductor device of the invention, the semiconductor crystal substrate having a pair of facing surfaces, one of which has the protrusions or the depressions, is used.

Other and further objects, features and advantages of the invention will appear more fully from the following description.

BRIEF DESCRIPTION OF THE DRAWINGS

FIGS. 3A to 3C are cross sectional views of the steps following the steps of FIGS. 2A and 2B.

DETAILED DESCRIPTION OF THE PREFERRED EMBODIMENTS

Preferred embodiments of the invention will be described in detail below with reference to the drawings.

First Embodiment

Figure 1:
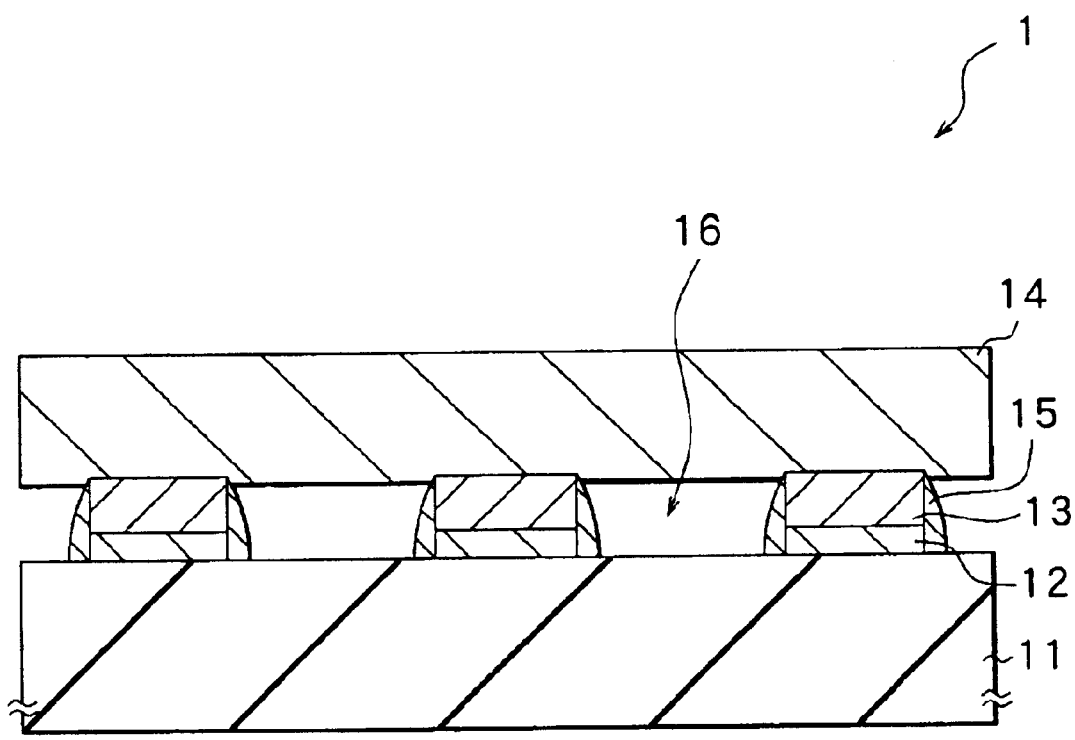
FIG. 1 is a cross sectional view of a structure of a semiconductor laminated substrate according to a first embodiment of the invention.

FIG. 1 shows a structure of a semiconductor laminated substrate 1 according to a first embodiment of the invention. The semiconductor laminated substrate 1 has, for example, a laminated structure comprising a base substrate 11, a separating layer 12, a buffer layer 13 and a semiconductor crystal layer 14 composed of a III–V nitride semiconductor, the layers 12, 13 and 14 being laminated in this order on one surface of the substrate 11 through the layers 12 and 13. The III–V nitride semiconductor contains, for example, at least one kind of element in a group of III elements consisting of gallium (Ga), aluminum (Al), boron (B) and indium (In) and at least nitrogen in a group of V elements consisting of nitrogen (N), phosphorus (P) and arsenic (As).

The base substrate 11 is a base for growing the semiconductor crystal layer 14 thereon through the separating layer 12 and the buffer layer 13. The base substrate 11 is made of, for example, sapphire, silicon, spine, neodymium gallate, lithium gallate, lithium aluminate, silicon oxide or the like. Incidentally, for example, the base substrate 11 is made of sapphire, and the separating layer 12 and so on are formed on a C-plane or an a-plane in this embodiment.

The separating layer 12 is used to isolate the semiconductor crystal layer 14 from the base substrate 11 and functions as a core for growing the buffer layer 13, and the separating layer 12 comprises of a nearly amorphous microcrystal grown at low temperature. The separating layer 12 is, for example, about 0.03 $\mu$m in thickness in the direction of lamination (hereinafter referred to as a thickness) and comprises of at least one of a kind of III–V compound semiconductor and II–VI compound semiconductor. The III–V compound semiconductor contains, for example, at least one kind of element in the above-described group of III elements and at least one kind of element in the above-described group of V elements. The II–VI compound semiconductor contains, for example, at least one kind of element in a group of II elements consisting of zinc (Zn), magnesium (Mg), beryllium (Be), cadmium (Cd), manganese (Mn) and mercury (Hg) and at least one kind of element in a group of VI elements consisting of oxygen (O), sulfur (S), selenium (Se) and tellurium (Te).

Above all, for example, it is preferable that the III–V compound semiconductor containing, aluminum of the III element is used as a material constituting the separating layer 12. Such a III–V compound semiconductor can be easily etched by an alkaline solution, and the separating layer 12 and the buffer layer 13 can be continuously grown in the same apparatus and easily manufactured because of the same III–V compound semiconductor as a semiconductor material constituting the buffer layer 13. Moreover, the higher a composition of aluminum in the III element is, the faster an etching speed is. It is therefore preferable that the composition of aluminum is high. Aluminum nitride (AlN) is particularly preferable because of the extremely fast etching speed (see J. R. Mileham, Appl. Phys. Lett., 67(8), 1119 (1995)).

Besides, it is preferable that the II–VI compound semiconductor containing oxygen, such as zinc oxide, magnesium oxide, calcium oxide (CaO) or manganese oxide (MnO), is used as the material constituting the separating layer 12. These materials can be also chemically etched with ease. However, these materials are the II–VI compound semiconductor that is different from the semiconductor material constituting the buffer layer 13. For forming the separating layer 12 by these materials, it is thus difficult to grow the separating layer 12 and the buffer layer 13 in the same apparatus. That is, it is more preferable that the III–V compound semiconductor containing aluminum, the III element is used as the material constituting the separating layer 12.

The separating layer 12 may have not only a single-layer structure, but also a multilayered structure composed of different materials. Incidentally, the separating layer 12 has the single-layer structure composed of aluminum nitride, for example in this embodiment.

The separating layers 12, for example, are distributed in the form of lines or islands, each having a width of a few micrometers to tens of micrometers, and are spaced at intervals of a few micrometers. Incidentally, for example, the separating layers 12 are distributed in the form of lines, each having a width of 4 $\mu$m, and are spaced at intervals of 4 $\mu$m in this embodiment. An anti-growing film 15 having a thickness of about 0.2 $\mu$m, for example, is provided on sides of the separating layer 12. Each flow-through hole 16 for flowing therethrough an etchant for etching the separating layer 12 is formed between the distributed separating layers 12 sandwiching the anti-growing films 15. Preferably, the sectional area of the flow-through hole 16 is such that the etchant can enter into the flow-through hole 16 to a few centimeters, e.g., a few micrometers to tens of micrometers.

The anti-growing film 15 is used to prevent the semiconductor crystal layer 14 from being formed on the sides of the separating layer 12 and thereby to form the flow-through hole 16. For example, the anti-growing film 15 is made of at least one of silicon oxide, silicon nitride, aluminum oxide and high melting point metal. Examples of the high melting point metal are tungsten (W), molybdenum (Mo) and so on. More preferably, silicon oxide, silicon nitride or the like is used as the material constituting the anti-growing film 15. These materials can be easily etched by hydrogen fluoride (HF) or the like.

Although the anti-growing film 15 may have the single-layer structure, the anti-growing film 15 may also have the multilayered structure composed of different materials. Incidentally, the anti-growing film 15 has the single-layer structure composed of silicon oxide, for example in this embodiment.

The buffer layer 13 is used to define a crystal orientation of the semiconductor crystal layer 14 and comprises the III–V compound semiconductor, for example. However, it is preferable that the buffer layer 13 contains and comprises at least one of the elements constituting the separating layer 12 and the elements constituting the semiconductor crystal layer 14. Such a buffer layer can have the same crystal form as the semiconductor crystal layer 14. The buffer layer 13 may be made of the same material as the separating layer 12, or the buffer layer 13 may be removed together with the separating layer 12 when the separating layer 12 is removed by etching. Incidentally, the buffer layer 13 is made of gallium nitride, for instance. About a few micrometers are sufficient for the thickness of the buffer layer 13, and the buffer layer 13 has a thickness of 1.5 μm, for example in this embodiment.

Moreover, the buffer layers 13 are distributed in the form of lines or islands corresponding to the separating layers 12, and the anti-growing films 15 are provided on the sides of the buffer layer 13. That is, similarly to the separating layer 12, each flow-through hole 16 is formed between the distributed buffer layers 13 sandwiching the anti-growing film 15. Thus, the sufficient sectional area of the flow-through hole 16 can be ensured.

The semiconductor crystal layer 14 may have the single-layer structure or the multilayered structure. Preferably, the semiconductor crystal layer 14 has at least one of the layers composed of gallium nitride, aluminum gallium nitride (AlGaN) or gallium indium nitride (GaInN), for example. The thickness of the semiconductor crystal layer 14 is appropriately determined in accordance with applications. Incidentally, the semiconductor crystal layer 14 has a thickness of about 15 μm, for example in this embodiment.

The semiconductor laminated substrate 1 having such a structure can be manufactured as follows, for instance.

Figure 2A:
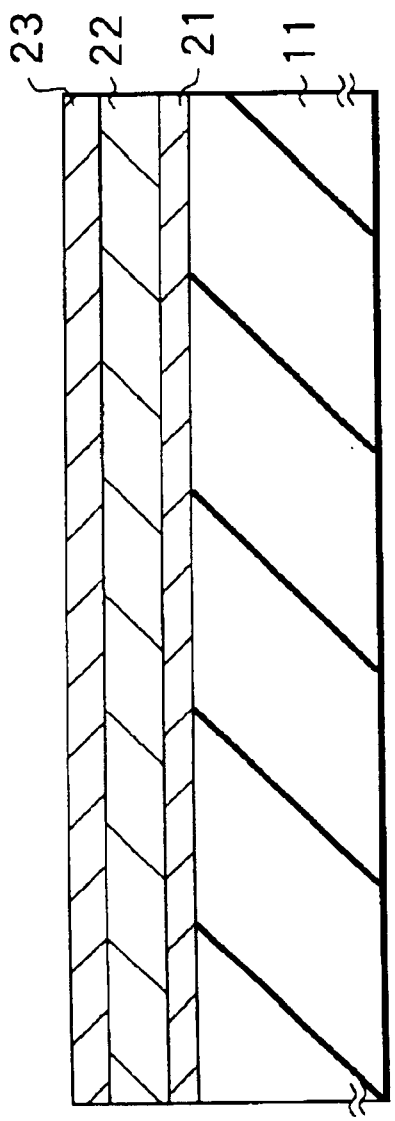
FIGS. 2A and 2B are cross sectional views of steps of a method of manufacturing the semiconductor laminated substrate shown in FIG. 1.

FIGS. 2A and 2B and FIGS. 3A to 3C show the steps of a method of manufacturing the semiconductor laminated substrate 1. First, for example, as shown in FIG. 2A, the base substrate 11 composed of sapphire is prepared, and the base substrate 11 is cleaned in an atmosphere of hydrogen gas (H$_2$) at 1050° C. Next, for example, the temperature is lowered to 550° C., and a separating layer growing layer 21 for forming the separating layer 12 is grown to a thickness of 0.03 μm on the C-plane of the base substrate 11 by MOCVD (Metal Organic Chemical Vapor Deposition). Then, for example, the temperature is increased to 1000° C., and a buffer layer growing layer 22 for forming the buffer layer 13 is grown to a thickness of 1.5 μm on the separating layer 12 by MOCVD, as in the case of the separating layer growing layer 21. After that, for example, a silicon dioxide film 23 is formed with a thickness of 0.2 μm on the buffer layer 13 by CVD (Chemical Vapor Deposition).

Figure 2B:
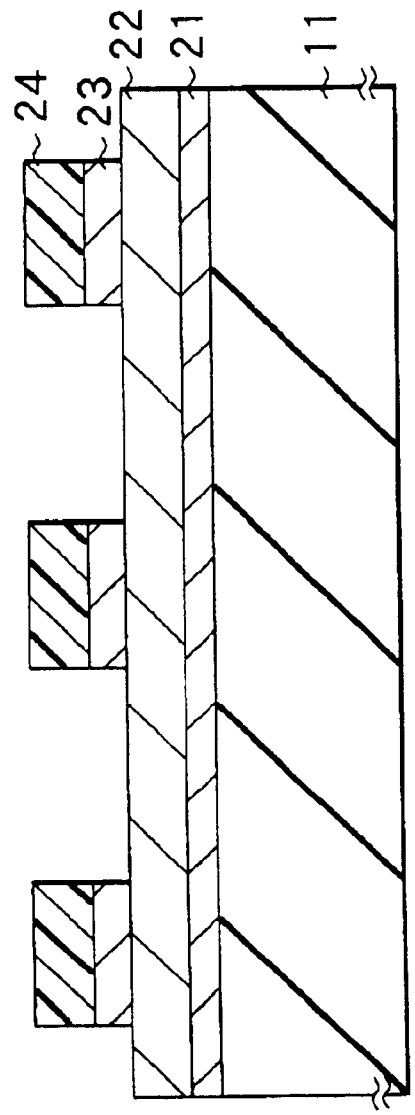

After the silicon dioxide film 23 is formed, for example, as shown in FIG. 2B, the silicon dioxide film 23 is coated with a photoresist film 24, and linear patterns, each having a width of 4 μm, are formed at intervals of 4 μm on the buffer layer growing layer 22 in the direction of crystal plane <1$\bar{1}$00>. Then, the silicon dioxide film 23 is selectively removed by the etching using the photoresist film 24 as a mask and using an aqueous solution containing hydrogen fluoride as the etchant, for example. After the silicon dioxide film 23 is selectively removed, the photoresist film 24 is removed.

After the photoresist film 24 is removed, for example, as shown in FIG. 3A, the buffer layer growing layer 22 and the separating layer growing layer 21 are selectively removed in sequence by the etching using the silicon dioxide film 23 as the mask and using chlorine series etching gas as the etchant, whereby the base substrate 11 is exposed. Thus, the linearly distributed buffer layers 13 and separating layers 12 are formed. Then, the silicon dioxide film 23 is removed by the etching using the aqueous solution containing hydrogen fluoride as the etchant, for example.

After the silicon dioxide film 23 is removed, for example, as shown in FIG. 3B, an anti-growing film forming film 25 for forming the anti-growing film 15 is formed with a thickness of 0.2 μm on the whole surface on the side of the buffer layer 13 by CVD. Then, for example, as shown in FIG. 3C, the anti-growing film forming film 25 is etched substantially perpendicularly to the base substrate 11 by RIE (Reactive Ion Etching), whereby the anti-growing film forming film 25 is selectively removed. Thus, a top surface of the buffer layer 13 is exposed, and the anti-growing film 15 is formed on at least a part of the sides of the buffer layer 13 and on the sides of the separating layer 12.

After the anti-growing film 15 is formed, for example, the semiconductor crystal layer 14 is grown to a thickness of 15 μm on the buffer layer 13 by MOCVD. At this time, the semiconductor crystal layer 14 starts growing on the exposed surface of the buffer layer 13 and grows also in the direction of crystal plane <11$\bar{2}$0>, i.e., the direction perpendicular to the direction in which the buffer layer 13 extends, and these grown portions coalesce into a flat surface. The semiconductor crystal layer 14 does not grow on the sides of the buffer layer 13 and the separating layer 12 coated with the anti-growing film. That is, the flow-through hole 16 is formed in the sides of the buffer layer 13 and of the separating layer 12 sandwiching the anti-growing film 15. Thus, the semiconductor laminated substrate 1 shown in FIG. 1 is obtained.

The semiconductor laminated substrate 1 thus manufactured is used after the separating layer 12 is etched and the semiconductor crystal layer 14 is isolated from the base substrate 11 as follows, for example.

Figure 4:
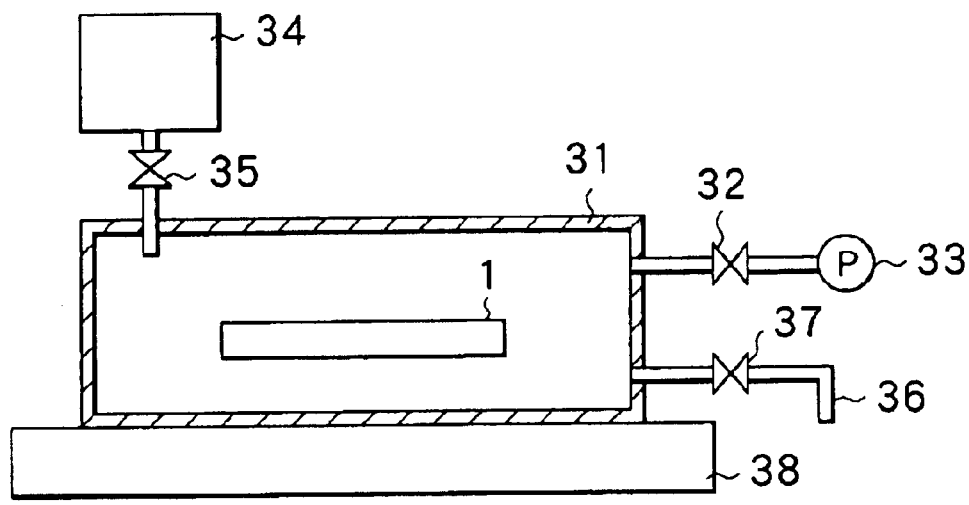
FIG. 4 is a partially sectional view of a configuration of an etching apparatus used for etching of a separating layer of the semiconductor laminated substrate shown in FIG. 1.

FIG. 4 shows a configuration of an etching apparatus for use in the etching of the separating layer 12 of the semiconductor laminated substrate 1. The etching apparatus comprises a container 31 for containing the semiconductor laminated substrate 1 therein. A vacuum pump 33 is connected to the container 31 through a valve 32 so that the interior of the container 31 can be changed into a reduced-pressure atmosphere. Moreover, a vessel 34 for the etchant is connected to the container 31 through a valve 35, and a discharge port 36 for discharging the etchant from the interior of the container 31 is provided on the container 31 through a valve 37. Furthermore, the container 31 can be heated by a heating apparatus 38.

Figure 5:
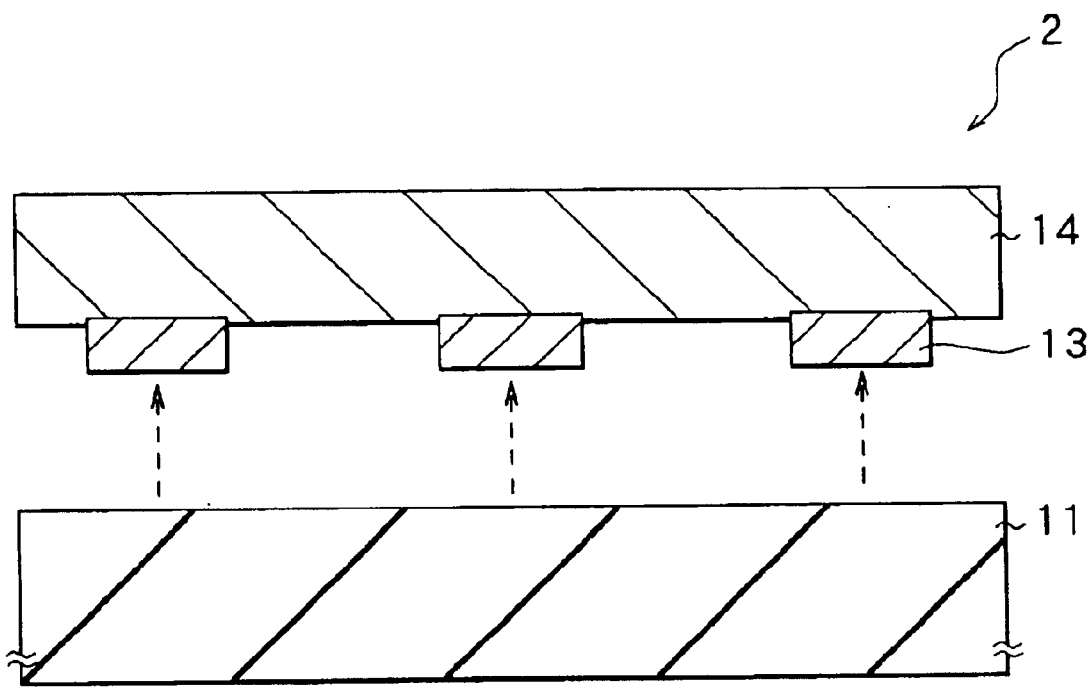
FIG. 5 is a cross sectional view of the semiconductor laminated substrate shown in FIG. 1 isolated by the separating layer.

FIG. 5 shows the semiconductor laminated substrate 1 isolated by the separating layer 12. First, for example, by using the etching apparatus shown in FIG. 4, the semiconductor laminated substrate 1 is placed into the container 31, the interior of the container 31 is changed into the reduced-pressure atmosphere by the vacuum pump 33, and then the aqueous solution containing hydrogen fluoride as the etchant for etching the anti-growing film 15 is introduced from the vessel 34 into the container 31. This allows the etchant to enter into the flow-through hole 16 of the semiconductor laminated substrate 1. Since the reduced-pressure atmosphere is provided prior to the introduction of the etchant, the etchant easily enters into the flow-through hole 16 by a capillary phenomenon without being substituted with gas. In this case, the heated etchant is more effective for an easy entry of the etchant. Since the flow-through hole 16 is formed in a side of the separating layer 12 and a side of the buffer layer 13 sandwiching the anti-growing film 15, the sectional area of the flow-through hole 16 has a sufficient size and thus the etchant easily flows through the flow-through hole 16.

Then, for example, the container 31 is heated at 50° C. and allowed to stand for 10 minutes, whereby the anti-growing film 15 is removed. Next, for example, the etchant in the container 31 is discharged from the discharge port 36, then the container 31 is heated at 100° C. and the interior of the container 31 is changed into the reduced-pressure atmosphere by the vacuum pump 33, whereby the interior of the container 31 is dried. Then, for example, the alkaline solution as the etchant for etching the separating layer 12 is introduced from the vessel 34 into the container 31, and the container 31 is heated at 80° C. and allowed to stand for 20 minutes. Thus, the etchant enters into the flow-through hole 16 and the separating layer 12 is dissolved, so that the base substrate 11 is isolated from the semiconductor crystal layer 14 as shown in FIG. 5. Since the reduced-pressure atmosphere is provided prior to the introduction of the etchant, the etchant easily enters into the flow-through hole 16 as mentioned above. Also in this case, the heated etchant is more effective for the entry of the etchant. Moreover, in this case, the sectional area off the flow-through hole 16 has a sufficient size as described above, and thus the etchant easily flows through the flow-through hole 16.

Additionally, since the separating layers 12 are distributed in the form of lines or islands and the flow-through hole 16 is formed in a side of the separating layer 12 sandwiching the anti-growing film 15, the base substrate 11 is isolated when the etching proceeds by the width of the separating layer 12. If the etching speed is assumed to be about a few micrometers per minute to tens of micrometers per minute, the separating layer 12 formed to have a width of a few micrometers to tens of micrometers is therefore etched within a few minutes to tens of minutes and thus the base substrate 11 is isolated within an extremely short time. The buffer layer 13 may be dissolved together with the separating layer 12 depending on the material constituting the buffer layer 13.

The semiconductor laminated substrate 1 is also isolated in the following manner. First, for example, by using the etching apparatus shown in FIG. 4, the semiconductor laminated substrate 1 is placed into the container 31 and the interior of the container 31 is changed into the reduced-pressure atmosphere. Then, the alkaline solution as the etchant for etching the anti-growing film 15 and the separating layer 12 is introduced into the container 31, and the container 31 is heated at 80° C. and allowed to stand for 60 minutes. Thus, the anti-growing film 15 and the separating layer 12 are dissolved, so that the base substrate 11 is isolated from the semiconductor crystal layer 14 as shown in FIG. 5. Also in this case, the etchant easily enters into and flows through the flow-through hole 16 as mentioned above. Moreover, the base substrate 11 is isolated within the extremely short time as described above. Also in this case, the buffer layer 13 is dissolved together with the separating layer 12 depending on the material constituting the buffer layer 13.

The semiconductor crystal layer 14 thus isolated from the base substrate 11 is used in a semiconductor device as a semiconductor crystal substrate 2. As shown in FIG. 5, for example, the semiconductor crystal substrate 2 has protrusions, which are formed by the protruding buffer layers 13 distributed in the form of lines or islands, on one surface of the semiconductor crystal layer 14 having a pair of facing surfaces. Although not shown in figure, when the buffer layer 13 is dissolved together with the separating layer 12, the semiconductor crystal substrate 2 has depressions, which are distributed in the form of lines or islands corresponding to the dissolved buffer layers 13, on one surface of the semiconductor crystal layer 14 having a pair of facing surfaces.

Thus, since the semiconductor laminated substrate 1 according to this embodiment has the flow-through hole 16 for flowing therethrough the etchant for etching the separating layer 12, the separating layer 12 can be easily etched and the base substrate 11 can be easily isolated. That is, the semiconductor crystal substrate 2 can be easily obtained. Therefore, the semiconductor device is formed by using the semiconductor laminated substrate 1 or the semiconductor crystal substrate 2, whereby cleavage can be employed, electrodes do not have to be positioned from the same side and heat radiation properties can be improved.

Moreover, since the flow-through hole 16 is provided in at least a part of the sides of the separating layer 12 sandwiching the anti-growing film 15, it is possible to prevent the semiconductor crystal layer 14 from growing on the sides of the separating layer 12 and to easily form the flow-through hole 16. Moreover, since the width of the separating layer 12 that must be etched can be reduced, the separating layer 12 can be easily etched and the time required for the etching can be reduced.

Furthermore, since the flow-through hole 16 is provided in a side of the buffer layer 13 sandwiching the anti-growing film 15, the sectional area of the flow-through hole 16 can be sufficiently increased and thus the etchant can easily flow through the flow-through hole 16. That is, the separating layer 12 can be easily etched.

In addition, since the method of manufacturing the semiconductor laminated substrate according to this embodiment includes the process of forming the flow-through hole 16, the semiconductor laminated substrate 1 and the semiconductor crystal substrate 2 according to this embodiment can be easily manufactured and realized.

Furthermore, in the method of isolating the semiconductor laminated substrate according to this embodiment, i.e., the method of manufacturing the semiconductor crystal substrate, the reduced-pressure atmosphere is provided and then the etchant is allowed to flow through the flow-through hole 16. Thus, the etchant can easily enter into the flow-through hole 16. Therefore, the separating layer 12 can be easily etched.

For example, an element structure is formed on the semiconductor crystal layer 14 in the following manner before the semiconductor laminated substrate 1 is isolated by the separating layer 12, and the semiconductor laminated substrate 1 having this structure may be used in the semiconductor device.

Figure 6:
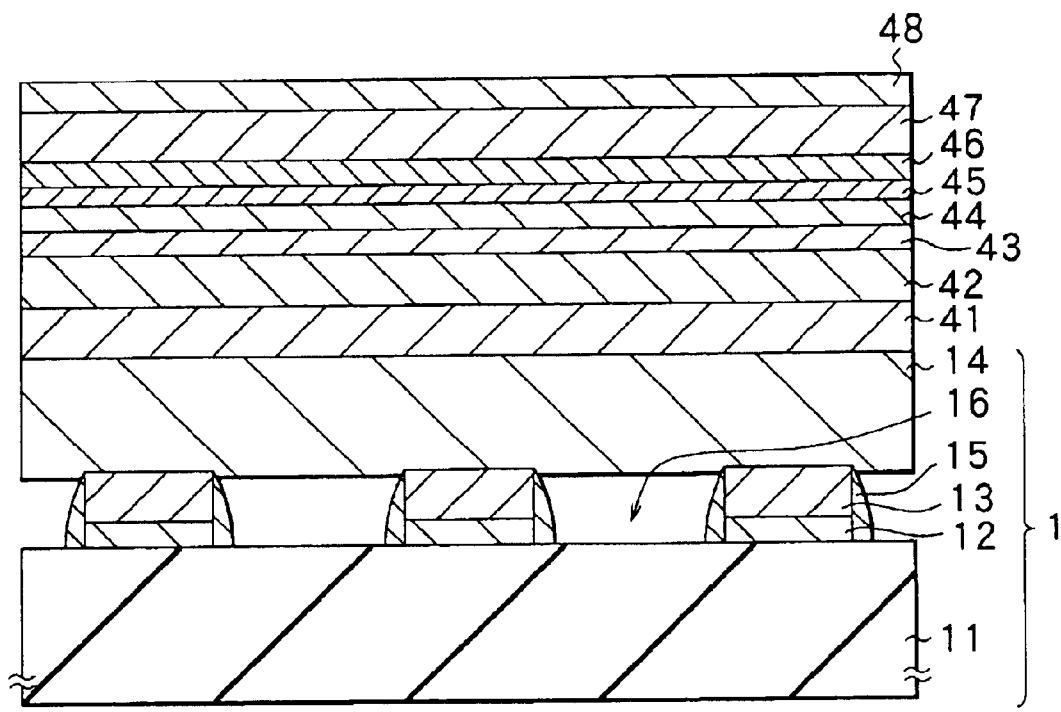
FIG. 6 is a cross sectional view of the structure of a light emitting device using the semiconductor laminated substrate shown in FIG. 1.

FIG. 6 shows the structure of a light emitting device that is an optical element using the semiconductor laminated substrate 1. The light emitting device has the laminated structure comprising, for example, an n-side contact layer 41, an n-type cladding layer 42, a first guide layer 43, a light emitting layer 44, an anti-deterioration layer 45, a second guide layer 46, a p-type cladding layer 47 and a p-side contact layer 48, these layers being laminated in sequence on the semiconductor crystal layer 14 of the semiconductor laminated substrate 1. In this case, for example, the buffer layer 13 and the semiconductor crystal layer 14 of the semiconductor laminated substrate 1 is made of n-type GaN doped with an n-type impurity such as silicon (Si).

For example, the n-side contact layer 41 has a thickness of 1 $\mu$m and is made of n-type GaN doped with the n-type impurity such as silicon. For example, the n-type cladding layer 42 has a thickness of 1.5 μm and is made of an n-type $Al_{0.07}Ga_{0.93}N$ compound crystal doped with the n-type impurity such as silicon. For example, the first guide layer 43 has a thickness of 0.1 μm and is made of n-type GaN doped with the n-type impurity such as silicon. For example, the light emitting layer 44 is made of an undoped-GaInN compound crystal not doped with the impurity and has the laminated structure comprising five periods of a barrier layer composed of a $Ga_{0.95}In_{0.05}N$ compound crystal of 10 nm thick and a well layer composed of a $Ga_{0.85}In_{0.05}N$ compound crystal of 3 nm thick.

For example, the anti-deterioration layer 45 has a thickness of 10 nm and is made of a p-type $Al_{0.2}Ga_{0.8}N$ compound crystal doped with a p-type impurity such as magnesium (Mg). For example, the second guide layer 46 has a thickness of 0.1 μm and is made of p-type GaN doped with the p-type impurity such as magnesium. For example, the p-type cladding layer 47 has a thickness of 1.5 μm and is made of a p-type $Al_{0.07}Ga_{0.93}N$ compound crystal doped with the p-type impurity such as magnesium. For example, the p-side contact layer 48 has a thickness of 0.2 μm and is made of a p-type GaN compound crystal doped with the p-type impurity such as magnesium.

The light emitting device is formed by sequentially laminating the n-side contact layer 41 to the p-side contact layer 48 on the semiconductor crystal layer 14 of the semiconductor laminated substrate 1 by means of MOCVD, for instance. The light emitting device, which is cleaved into parts of a predetermined size, is used after the base substrate 11 is isolated by the separating layer 12 as described above, for example.

Since the light emitting device uses the semiconductor laminated substrate 1 according to this embodiment, the base substrate 11 can be easily isolated. Therefore, the sides can be formed by employing the cleavage, the electrodes can be provided on the semiconductor crystal layer 14 and the p-side contact layer 48, and thus the light emitting device can be easily manufactured. Moreover, the heat radiation properties can be improved, so that a temperature rise of the light emitting layer 44 is prevented and thus the deterioration of the device or element can be prevented.

In the above description, the base substrate 11 is isolated after the element structure is formed on the semiconductor crystal layer 14 of the semiconductor laminated substrate 1. However, for example, the element structure may be formed on one surface of the semiconductor crystal substrate 2 after the semiconductor laminated substrate 1 is isolated into the semiconductor crystal substrate 2 and the base substrate 11 by the separating layer 12.

Figure 7:
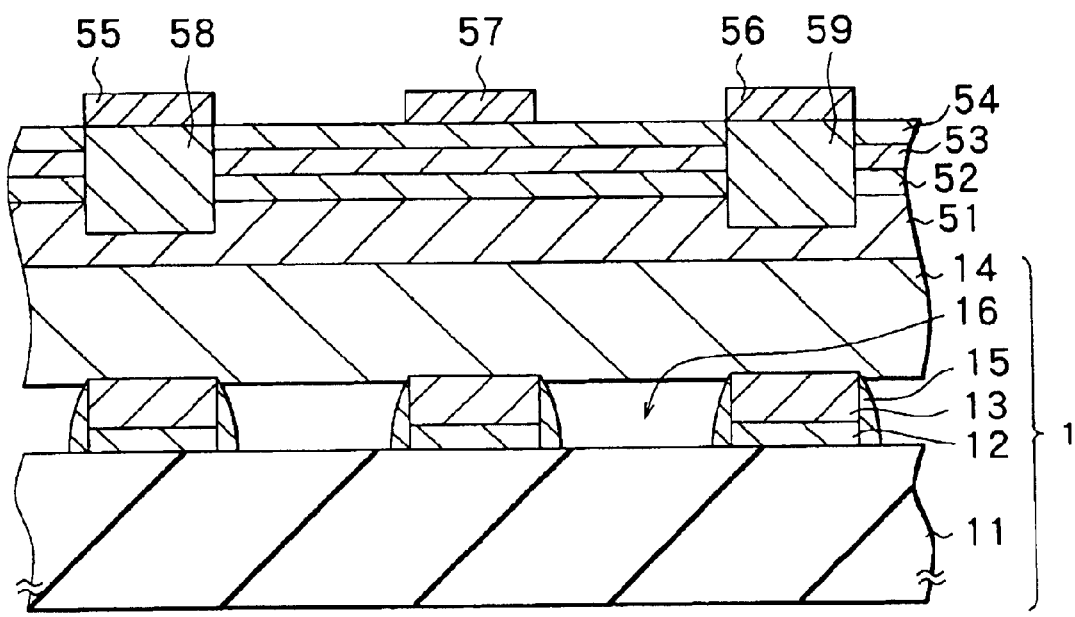
FIG. 7 is a cross sectional view of the structure of a field effect element using the semiconductor laminated substrate shown in FIG. 1.

FIG. 7 shows the structure of a field effect element using the semiconductor laminated substrate 1. The field effect element has the laminated structure comprising, for example, a channel layer 51, a barrier layer 52, a carrier supply layer 53 and a barrier layer 54, these layers being laminated in sequence on the semiconductor crystal layer 14 of the semiconductor laminated substrate 1. In this case, for instance, the semiconductor crystal layer 14 of the semiconductor laminated substrate 1 is made of p-type GaN of high resistance doped with about $5 \times 10^{17}$ cm$^{-2}$ of the p-type impurity such as magnesium.

For example, the channel layer 51 has a thickness of 0.5 μm and is made of undoped-GaN not doped with the impurity. For example, the barrier layer 52 has a thickness of 10 nm and is made of undoped-$Al_{0.15}Ga_{0.85}N$ not doped with the impurity. For example, the carrier supply layer 53 has a thickness of 20 nm and is made of n-type $Al_{0.15}Ga_{0.85}N$ heavily doped with about $3 \times 10^{18}$ cm$^{-2}$ of the n-type impurity such as silicon. For example, the barrier layer 54 has a thickness of 10 nm and is made of n-type $Al_{0.15}Ga_{0.85}N$ lightly doped with about $5 \times 10^{15}$ cm$^{-2}$ of the n-type impurity such as silicon.

A source electrode 55 and a drain electrode 56 are spaced away from each other on the surface of the barrier layer 54, and a gate electrode 57 is located between the source electrode 55 and the drain electrode 56. A source region 58 whose resistance is reduced by alloying is located between the source electrode 55 and the channel layer 51. A drain region 59 whose resistance is similarly reduced by the alloying is located between the drain electrode 56 and the channel layer 51.

The field effect element is formed in the following manner, for instance. First, the layers 51 to 54 are laminated in sequence on the semiconductor crystal layer 14 of the semiconductor laminated substrate 1 by MOCVD, for example. Then, for example, the source electrode 55 and the drain electrode 56 are vapor deposited on the barrier layer 54, and the source region 58 and the drain region 59 are formed by means of the alloying by heating. Then, the gate electrode 57 is vapor deposited on the barrier layer 54. In this manner, the field effect element shown in FIG. 7 is obtained.

The field effect element, which is isolated into parts in a predetermined size, is used after the base substrate 11 is isolated by the separating layer 12 as described above, for example.

Since the field effect element uses the semiconductor laminated substrate 1 according to this embodiment, the base substrate 11 can be easily isolated. Therefore, the heat radiation properties can be improved, so that the temperature rise of the channel layer 51 and the deterioration of the element can be prevented.

In the above description, the base substrate 11 is isolated after the element structure is formed on the semiconductor crystal layer 14 of the semiconductor laminated substrate 1. However, for example, the element structure may be formed on one surface of the semiconductor crystal substrate 2 after the semiconductor laminated substrate 1 is isolated into the semiconductor crystal substrate 2 and the base substrate 11 by the separating layer 12.

Figure 8:
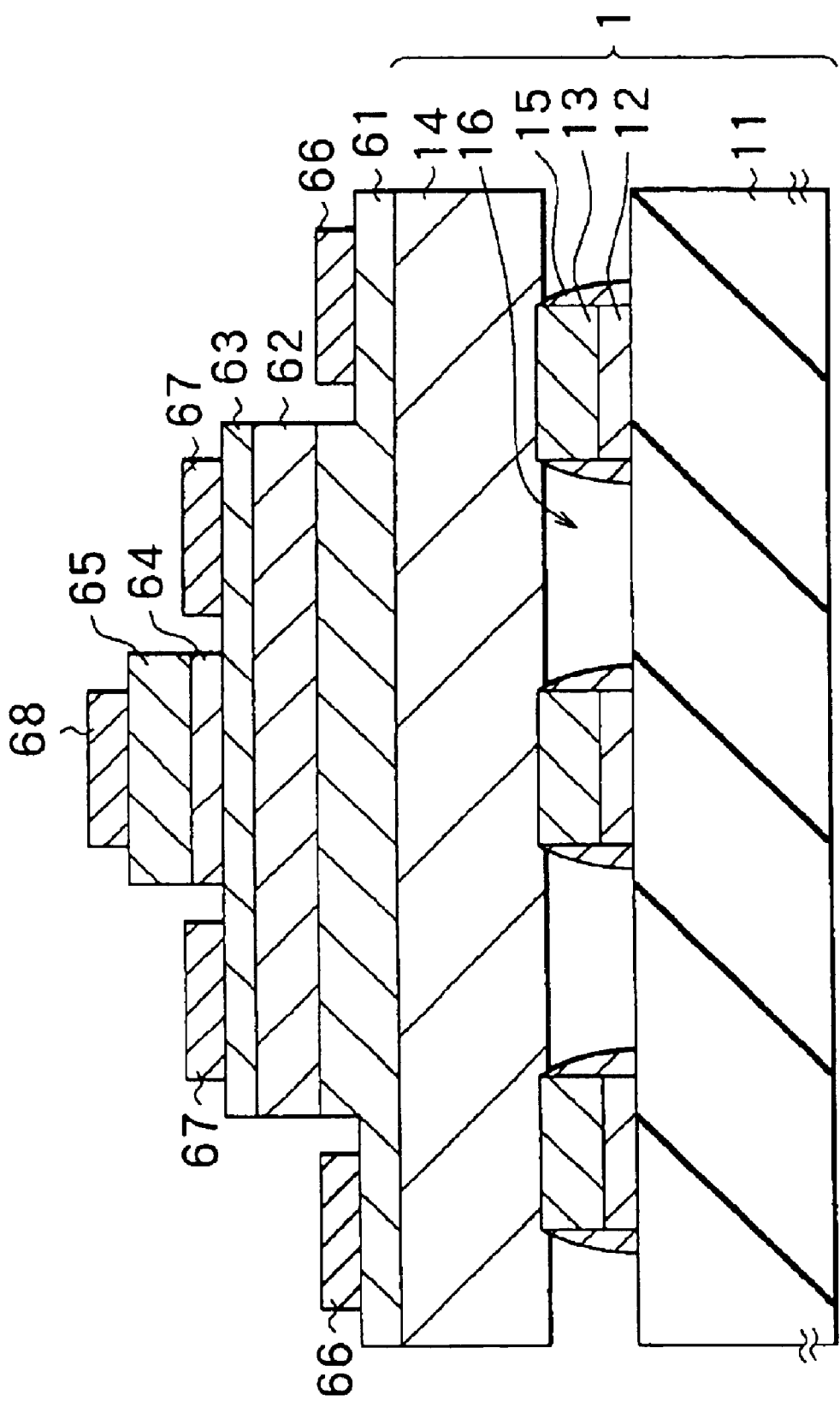
FIG. 8 is a cross sectional view of the structure of a bipolar electronic element using the semiconductor laminated substrate shown in FIG. 1.

FIG. 8 shows the structure of a bipolar electronic element using the semiconductor laminated substrate 1. The bipolar electronic element has the laminated structure comprising, for example, a collector contact layer 61, a collector layer 62, a base layer 63, an emitter layer 64 and an emitter contact layer 65, these layers being laminated in sequence on the semiconductor crystal layer 14 of the semiconductor laminated substrate 1. In this case, for example, the semiconductor crystal layer 14 of the semiconductor laminated substrate 1 is made of undoped-GaN not doped with the impurity.

For example, the collector contact layer 61 has a thickness of 2 μm and is made of n-type GaN heavily doped with the n-type impurity such as silicon. For example, the collector layer 62 has a thickness of 1 μm and is made of n-type GaN lightly doped with the n-type impurity such as silicon. For example, the base layer 63 has a thickness of 0.3 μm and is made of p-type GaInN doped with the p-type impurity such as magnesium. For example, the emitter layer 64 has a thickness of 0.3 μm and is made of n-type AlGaN lightly doped with the n-type impurity such as silicon. For example, the emitter contact layer 65 has a thickness of 1 μm and is made of n-type GaN heavily doped with the n-type impurity such as silicon.

A collector electrode 66 is located on the collector contact layer 61, a base electrode 67 is located on the base layer 63, and an emitter electrode 68 is located on the emitter contact layer 65.

The bipolar electronic element is formed in the following manner, for example. First, the layers 61 to 65 are laminated in sequence on the semiconductor crystal layer 14 of the semiconductor laminated substrate 1 by MOCVD, for example. Then, for instance, the emitter contact layer 65 and the emitter layer 64 are selectively etched in sequence, whereby a part of the base layer 63 is exposed. Then, for example, the layers 65, 64, 63 and 62 are selectively etched in sequence, whereby a part of the collector contact layer 61 is exposed. After that, the collector electrode 66, the base electrode 67 and the emitter electrode 68 are vapor deposited, respectively. In this manner, the bipolar electronic element shown in FIG. 8 is obtained.

The bipolar electronic element, which is isolated into parts in a predetermined size, is used after the base substrate 11 is isolated by the separating layer 12 as described above, for example.

Since the bipolar electronic element uses the semiconductor laminated substrate 1 according to this embodiment, the base substrate 11 can be easily isolated. Therefore, the heat radiation properties can be improved, so that the temperature rise of the base layer 63 is prevented and thus the deterioration of the element can be prevented.

In the above description, the base substrate 11 is isolated after the element structure is formed on the semiconductor crystal layer 14 of the semiconductor laminated substrate 1. However, for example, the element structure may be formed on one surface of the semiconductor crystal substrate 2 after the semiconductor laminated substrate 1 is isolated into the semiconductor crystal substrate 2 and the base substrate 11 by the separating layer 12.

Figure 9:
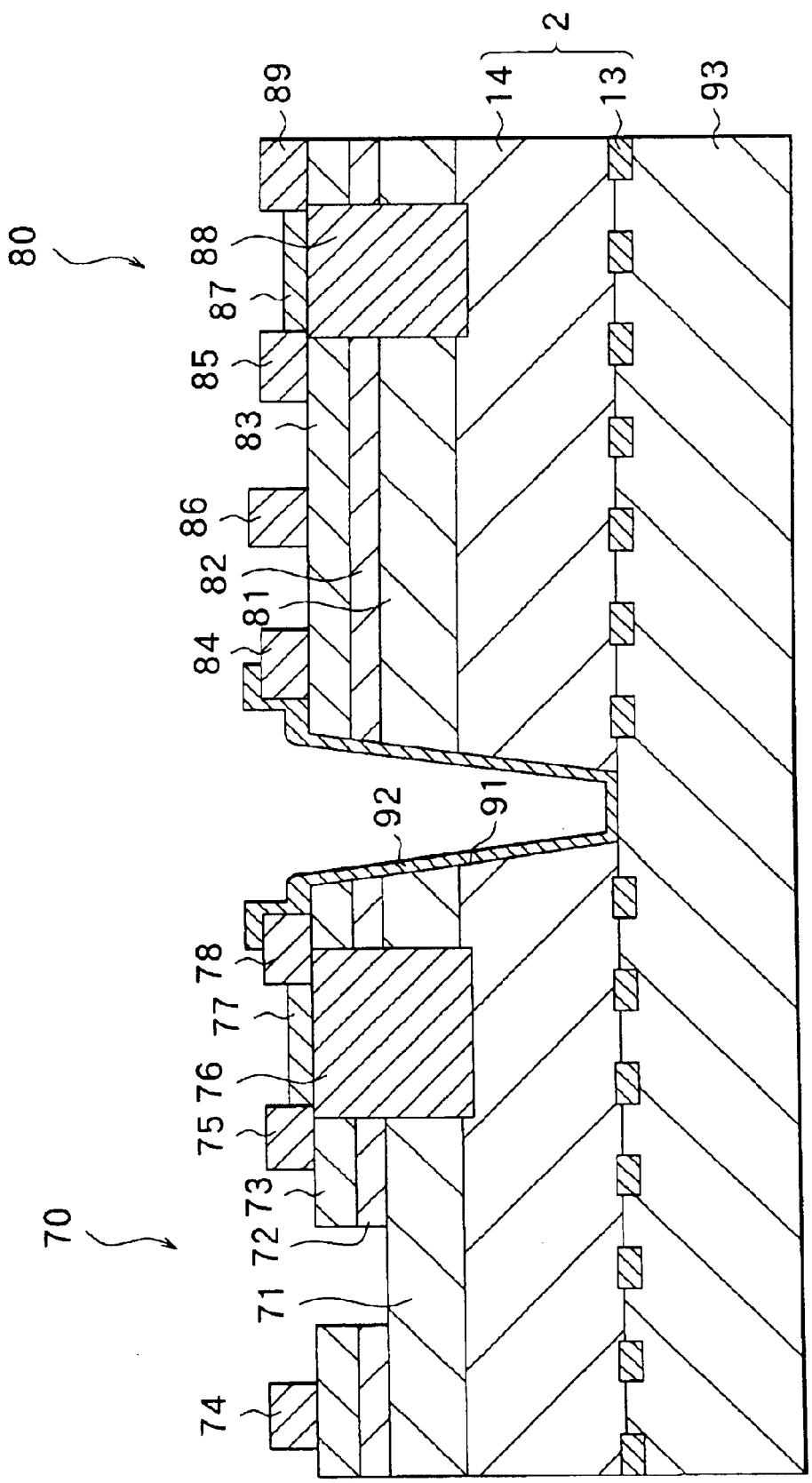
FIG. 9 is a cross sectional view of the structure of a photoelectronic element using the semiconductor laminated substrate shown in FIG. 1.

FIG. 9 shows the structure of a photoelectronic element using the semiconductor laminated substrate 1. The photoelectronic element has a photodetector 70 that is the optical element and a field effect element 80 are formed on the semiconductor crystal substrate 2 obtained by isolating the semiconductor laminated substrate 1 by the separating layer 12. For example, the semiconductor crystal layer 14 of the semiconductor crystal substrate 2 is made of p-type GaN of high resistance doped with about $5 \times 10^{17}$ cm$^{-2}$ of the p-type impurity such as magnesium.

For example, the region for forming the photodetector 70 has the laminated structure comprising a channel layer 71, an undoped-AlGaN layer 72 and a heavily-doped AlGaN layer 73 which are laminated in sequence on the semiconductor crystal substrate 2. A pair of Schottky electrodes 74 and 75 is provided on the heavily-doped AlGaN layer 73 to be spaced away from each other. The heavily-doped AlGaN layer 73 and the undoped-AlGaN layer 72 are removed from the region between the Schottky electrodes 74 and 75, and thus the channel layer 71 is exposed in this region. Thus, the channel layer 71 has no carrier, and therefore the channel layer 71 has high resistance when it is not irradiated with the light. Moreover, a high-resistance layer 76 is formed across the layers 73, 72 and 71 so that the high-resistance layer 76 may be adjacent to the Schottky electrode 75. A thin film resistor 77 composed of nickel is formed on the surface of the high-resistance layer 76, and the thin film resistor 77 is connected to the Schottky electrode 75. The thin film resistor 77 is connected to a metal layer 93 formed on a rear surface of the semiconductor crystal substrate 2 through a wiring 92 formed on an electrode 78 and a via hole 91.

For example, the region for forming the field effect element 80 has the laminated structure comprising a channel layer 81, a barrier layer 82 and a carrier supply layer 83 which are laminated in sequence on the semiconductor crystal substrate 2. A source electrode 84 and a drain electrode 85 are spaced away from each other on the carrier supply layer 83, and a gate electrode 86 is located between the source electrode 84 and the drain electrode 85. The source electrode 84 and the drain electrode 85 are ohmic-connected to the channel layer 81 by the alloying. The source electrode 84 is connected to the metal layer 93 through the wiring 92. Moreover, a high-resistance layer 87 is formed across the layers 83, 82 and 81 so as to adjacent to the drain electrode 85. A thin film resistor 88 composed of nickel is formed on the surface of the high-resistance layer 87 to be connected to the drain electrode 85 and an electrode 89.

Figure 10:
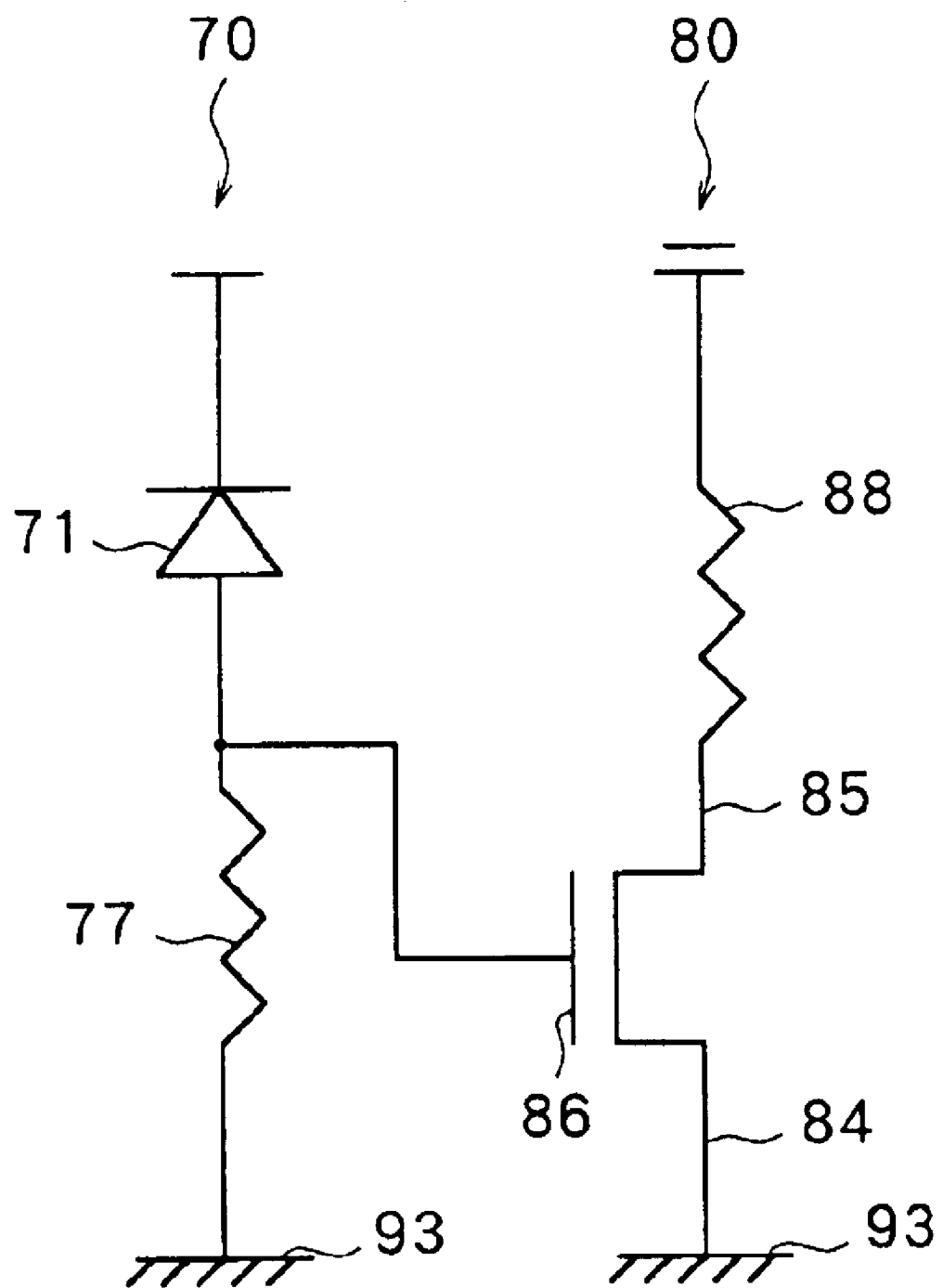
FIG. 10 is a circuit diagram of a circuit configuration of the photoelectronic element shown in FIG. 9.

For example, the channel layers 71 and 81 have a thickness of 3 µm and is made of undoped-GaN not doped with the impurity, respectively. For example, the undoped-AlGaN layer 72 and the barrier layer 82 have a thickness of 10 nm and is made of undoped-Al$_{0.15}$Ga$_{0.85}$N not doped with the impurity, respectively. For examples, the heavily-doped AlGaN layer 73 and the carrier supply layer 83 have a thickness of 30 nm and is made of n-type Al$_{0.15}$Ga$_{0.85}$N heavily doped with about $1 \times 10^{18}$ $^{cm-2}$ of the n-type impurity such as silicon, respectively. Although not shown in FIG. 9, the Schottky electrode 75 of the photodetector 70 is connected to the gate electrode 86 of the field effect element 80 through the wiring. That is, the photoelectronic element has a circuit configuration shown in FIG. 10.

The photoelectronic element is formed in the following manner, for example. First, the channel layer 71, the undoped-AlGaN layer 72 and the heavily-doped AlGaN layer 73 are formed in the region for forming the photodetector 70 on the semiconductor crystal layer 14 of the semiconductor laminated substrate 1 by MOCVD, for example. The channel layer 81, the barrier layer 82 and the carrier supply layer 83 are formed in the region for forming the field effect element 80 on the semiconductor crystal layer 14 of the semiconductor laminated substrate 1 by MOCVD, for example. In this case, the layers 71 to 73 and the layers 81 to 83 are formed through the same process. Then, for example, boron (B) is selectively ion implanted, whereby the high-resistance layers 76 and 87 are formed. Then, for example, the thin film resistors 77 and 88 are selectively vapor deposited. The electrode 78, the source electrode 84, the drain electrode 85 and the electrode 89 are selectively vapor deposited. The alloying is performed by the heating at about 600° C. After that, the Schottky electrodes 74 and 75 and the gate electrode 86 are selectively vapor deposited.

After the Schottky electrodes 74 and 75 are formed, for example, the heavily-doped AlGaN layer 73 and the undoped-AlGaN layer 72 are selectively removed from the region between the Schottky electrodes 74 and 75 by dry etching using chlorine series etching gas. Then, for example, the layers ranging from the heavily-doped AlGaN layer 73 and the carrier supply layer 83 to the semiconductor crystal layer 14 and the buffer layer 13 are selectively removed from the region between the photodetector 70 and the field effect element 80 by the dry etching using chlorine series etching gas, whereby the via hole 91 is formed. After the via hole 91 is formed, gold (Au) or the like is vapor deposited on the surface of the via hole 91 to a thickness of about 1 µm, whereby the wiring 92 is formed. Then, the separating layer 12 of the semiconductor laminated substrate 1 is etched in the above-described manner, whereby the base substrate 11 is isolated. After the base substrate 11 is isolated, the buffer layer 13 of the semiconductor crystal layer 14 (i.e., the buffer layer 13 of the semiconductor crystal substrate 2) is plated with gold or the like to a thickness of about 30 μm. In this manner, the field effect element shown in FIG. 9 is obtained.

Since the photoelectronic element uses the semiconductor laminated substrate 1 according to this embodiment, the base substrate 11 can be easily isolated. Therefore, the heat radiation properties can be improved, so that the temperature rise of the channel layers 71 and 81 is prevented and thus the deterioration of the element can be prevented. Moreover, it is not necessary to reduce the thickness of the semiconductor crystal substrate 2 by lapping. Furthermore, the via hole 91 can be formed from the direction of the heavily-doped AlGaN layer 73 and the carrier supply layer 83. Thus, a masking process from the direction of the semiconductor crystal substrate 2 is not required, so that a manufacturing process can be simplified.

Second Embodiment

Figure 11:
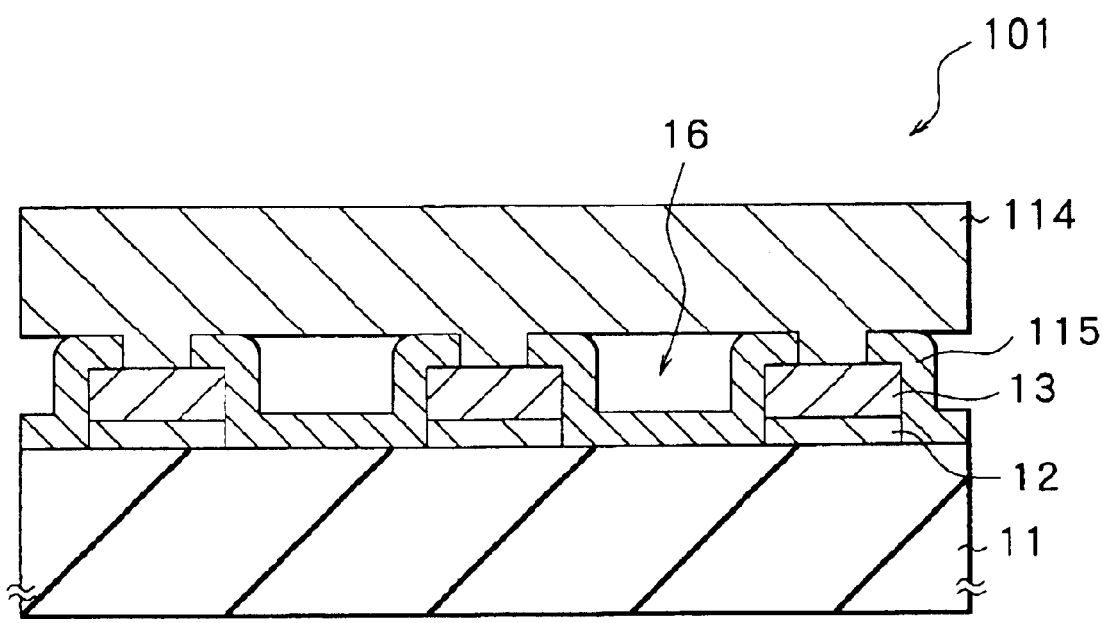
FIG. 11 is a cross sectional view of the structure of the semiconductor laminated substrate according to a second embodiment of the invention.

FIG. 11 shows the structure of a semiconductor laminated substrate 101 according to a second embodiment of the invention. The semiconductor laminated substrate 101 has the same structure as the first embodiment except that the structures of an anti-growing film 115 and a semiconductor crystal layer 114 are different from those of the first embodiment. Accordingly, the same elements are indicated by the same reference numerals, and the corresponding elements are indicated by the reference numerals having the hundred place "1". Thus, the detailed description of these elements is omitted.

The anti-growing film 115 has the same structure as the anti-growing film 15 of the first embodiment except that the sides of the separating layer 12 and the buffer layer 13 and a part of the top surface of the buffer layer 13 are coated with the anti-growing film 115. The anti-growing film 115 is formed so that the top surface of the buffer layer 13 may be exposed by a width of about 2 μm. Thus, since the semiconductor crystal layer 114 starts growing on the exposed top surface of the buffer layer 13, the protrusion corresponding to the buffer layer 13 is formed on the surface of the semiconductor crystal layer 114 close to the buffer layer 13. The other structure of the semiconductor crystal layer 114 is the same as that of the semiconductor crystal layer 14 of the first embodiment.

Figure 12:
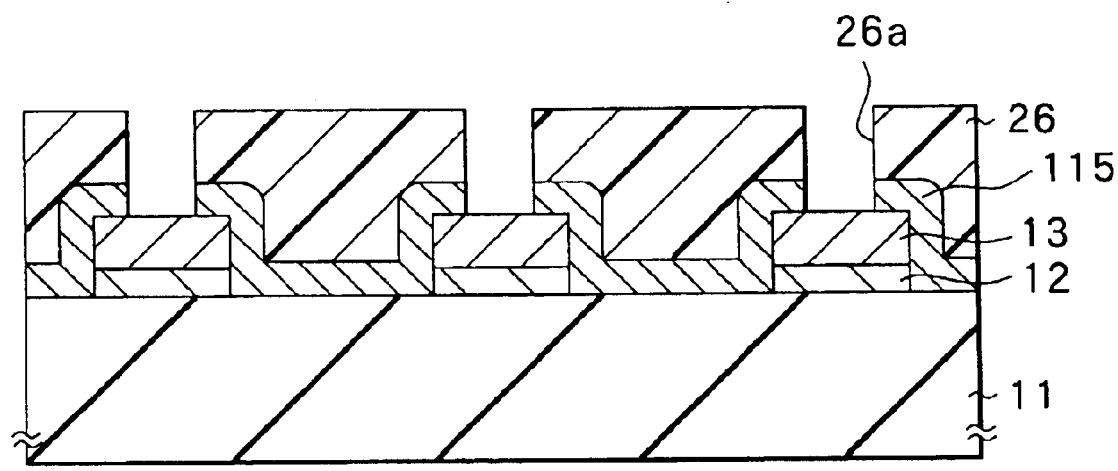
FIG. 12 is a cross sectional view of one step of the method of manufacturing the semiconductor laminated substrate shown in FIG. 11.

The semiconductor laminated substrate 101 can be manufactured in the same manner as the first embodiment except that the forming process of the anti-growing film 115 is different from that of the anti-growing film 15 of the first embodiment. FIG. 12 shows the process of manufacturing the semiconductor laminated substrate 101.

First, for example, as shown in FIGS. 2A to 3B, in the same manner as the first embodiment, the separating layers 12 and the buffer layers 13 distributed in the form of lines or islands are formed, and then the anti-growing film forming film 25s are formed thereon. Then, for example, as shown in FIG. 12, the anti-growing film forming film 25 is coated with a photoresist film 26, and an opening 26a is formed so as to correspond to the buffer layer 13. Then, for example, the anti-growing film forming film 25 is selectively removed by the etching using the photoresist film 26 as the mask and using the aqueous solution containing hydrogen fluoride as the etchant. Thus, the anti-growing film 115 is formed, and the top surface of the buffer layer 13 is partially exposed.

Then, for example, the semiconductor crystal layer 114 is grown in the same way as the first embodiment. The semiconductor crystal layer 114 has the same structure as the first embodiment except that the top surface of the buffer layer 13 is partially coated with the anti-growing film 115. Thus, similarly to the first embodiment, the flow-through hole 16 is formed in a side of the separating layer 12 and the buffer layer 13 sandwiching the anti-growing film 115, and the semiconductor crystal layer 114 is formed on the buffer layer 13. In this manner, the semiconductor laminated substrate 101 shown in FIG. 11 is obtained.

Figure 13:
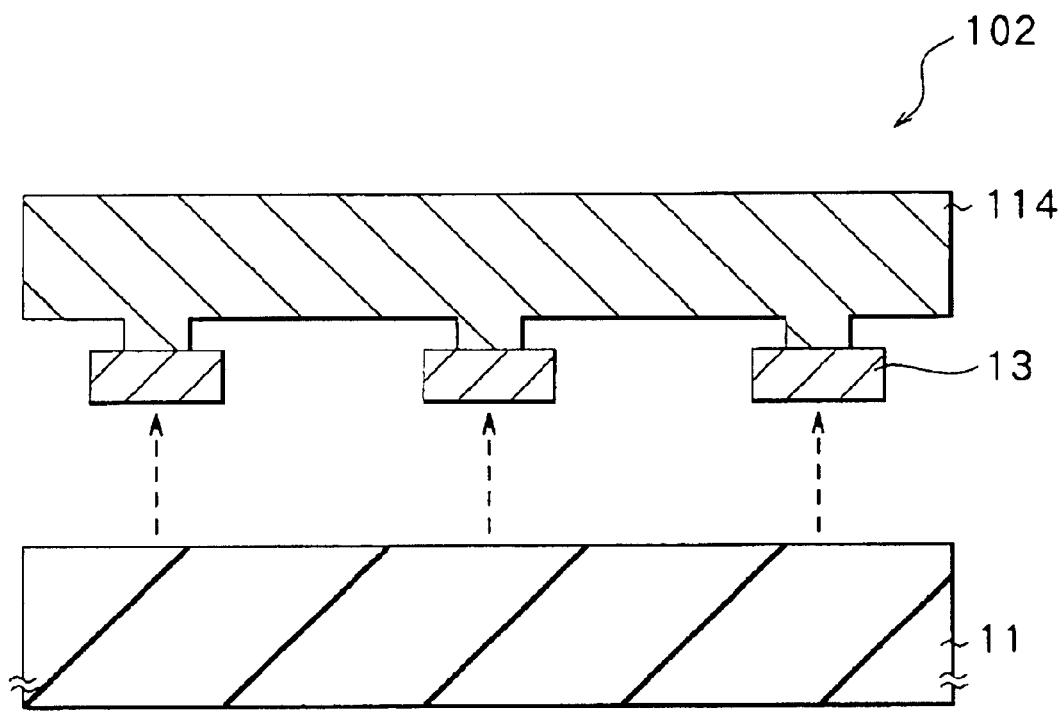
FIG. 13 is a cross sectional view of the semiconductor laminated substrate shown in FIG. 11 isolated by the separating layer.

Moreover, the semiconductor laminated substrate 101 is used in the same manner as the first embodiment. FIG. 13 shows the semiconductor laminated substrate 101 isolated by the separating layer 12. As shown in this drawing, also in the case of the semiconductor laminated substrate 101, the base substrate 11 is isolated by etching the separating layer 12 in the same manner as the first embodiment. In this case, the buffer layer 13 may be etched together with the separating layer 12 depending on the material constituting the buffer layer 13. The semiconductor crystal layer 114 isolated from the base substrate 11 is used as a semiconductor crystal substrate 102 in the same manner as the first embodiment. For example, similarly to the first embodiment, the semiconductor crystal substrate 102 has the protrusions, which are formed by the protruding buffer layers 13 distributed in the form of lines or islands, on one surface of the semiconductor crystal layer 114 having a pair of facing surfaces. Although not shown, when the buffer layer 13 is dissolved together with the separating layer 12, the semiconductor crystal substrate 102 has the protrusions, which are distributed in the form of lines or islands at the positions corresponding to the dissolved buffer layers 13, on one surface of the semiconductor crystal layer 114 having a pair of facing surfaces.

The semiconductor laminated substrate 101 according to this embodiment has the same structure as the first embodiment except that the anti-growing film 115 is formed so that the sides of the separating layer 12 and the buffer layer 13 and a part of the top surface of the buffer layer 13 may be coated with the anti-growing film 115. Therefore, the semiconductor laminated substrate 101 has the same effect as the first embodiment.

Third Embodiment

Figure 14:
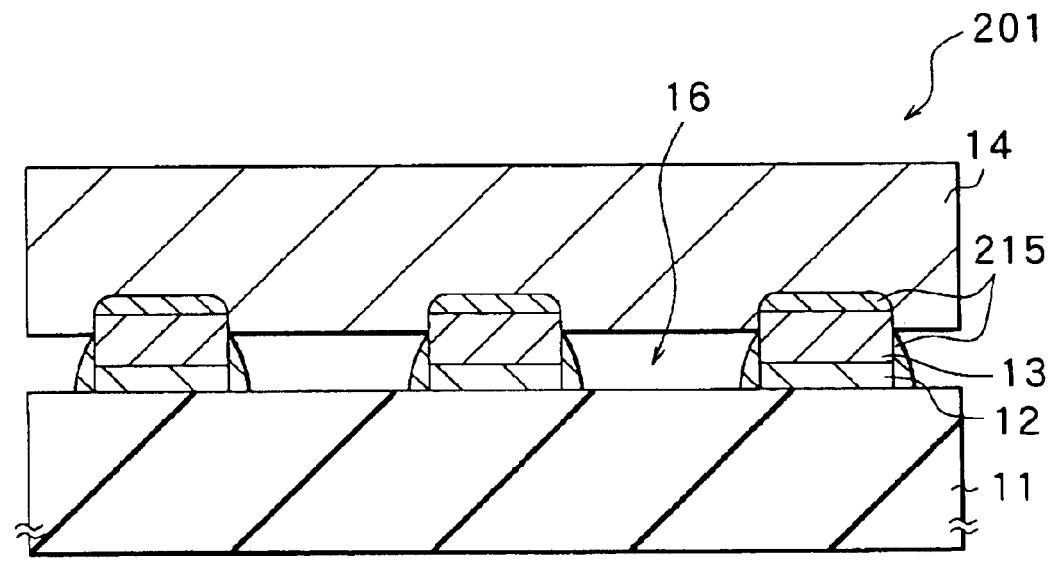
FIG. 14 is a cross sectional view of the structure of the semiconductor laminated substrate according to a third embodiment of the invention.

FIG. 14 shows the structure of a semiconductor laminated substrate 201 according to a third embodiment of the invention. The semiconductor laminated substrate 201 has the same structure as the first embodiment except that the structure of an anti-growing film 215 is different from that of the first embodiment. Accordingly, the same elements are indicated by the same reference numerals, and the corresponding elements are indicated by the reference numerals having the hundred place "2". Thus, the detailed description of these elements is omitted.

The anti-growing film 215 has the same structure as the anti-growing film 15 of the first embodiment except that the sides of the separating layer 12, a part of the sides of the buffer layer 13 and at least a part of the top surface of the buffer layer 13 are coated with the anti-growing film 215. The anti-growing film 215 is formed so that the upper sides of the buffer layer 13 may be exposed by about 1 μm. Thus, the semiconductor crystal layer 14 starts growing on the exposed portion of the buffer layer 13, namely, a part of the sides of the buffer layer 13.

The semiconductor laminated substrate 201 can be manufactured in the same manner as the first embodiment except that the forming process of the anti-growing film 215 is different from that of the anti-growing film 15 of the first embodiment. First, for example, as shown in FIGS. 2A to 3B, in the same manner as the first embodiment, the separating layers 12 and the buffer layers 13 distributed in the form of lines or islands are formed, and then the anti-growing film forming films 25 are formed thereon. Then, for example, the anti-growing film forming film 25 is etched at an angle of about 45° with respect to the base substrate 11 by RIE, whereby the anti-growing film forming film 25 is selectively removed. Thus, the upper sides of the buffer layer 13 is partially exposed, and the anti-growing film 215 is formed on the top surface and the lower sides of the buffer layer 13 and on the sides of the separating layer 12.

Figure 15:
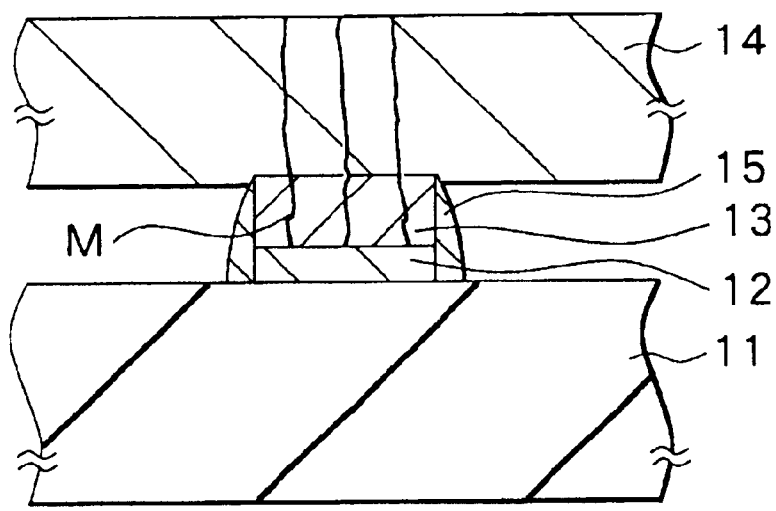
FIG. 15 is a cross sectional view of a state of the through dislocation of the semiconductor laminated substrate shown in FIG. 1.
Figure 16:
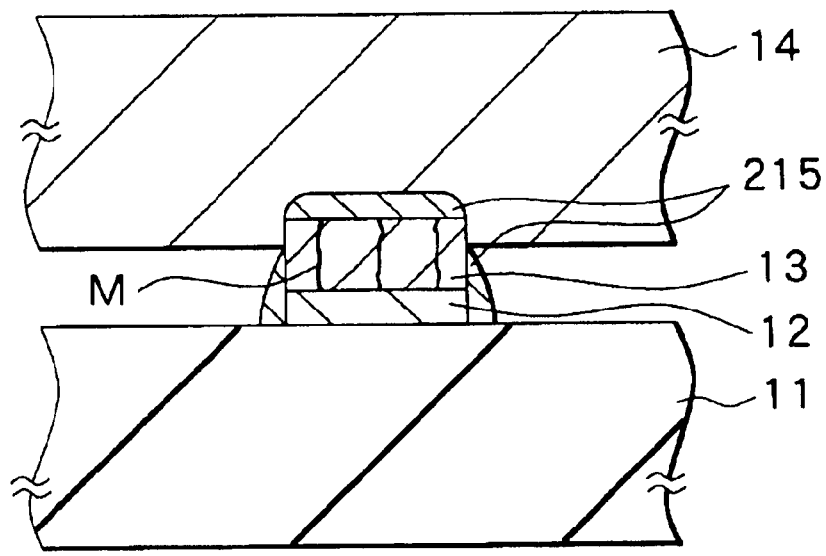
FIG. 16 is a cross sectional view of the state of the through dislocation of the semiconductor laminated substrate shown in FIG. 14.

Then, for example, the semiconductor crystal layer 14 is grown in the same manner as the first embodiment. The anti-growing film 215 is formed so that the buffer layer 13 and the separating layer 12 may be coated with the anti-growing film 215 except the upper sides of the buffer layer 13. Thus, the semiconductor crystal layer 14 starts transversely growing on the exposed sides of the buffer layer 13 and also transversely grows on the buffer layer 13. Thus, for example, as shown in FIG. 15, in the semiconductor laminated substrate 1 of the first embodiment in which the anti-growing film 15 is not formed on the buffer layer 13, through dislocation M in the buffer layer 13 propagates through the semiconductor crystal layer 14 as it is. On the other hand, in this embodiment, as shown in FIG. 16, the through dislocation M is blocked by the anti-growing film 215 on the buffer layer 13 and thus the through dislocation M does not propagate through the semiconductor crystal layer 14. Defects in the semiconductor crystal layer 14 are therefore reduced.

Since the anti-growing film 215 is formed on the sides of the separating layer 12 and a part of the sides of the buffer layer 13, the flow-through hole 16 is formed in the sides of the separating layer 12 and the buffer layer 13 sandwiching the anti-growing film 215 similarly to the first embodiment. Thus, the semiconductor laminated substrate 201 shown in FIG. 14 is obtained.

Figure 17:
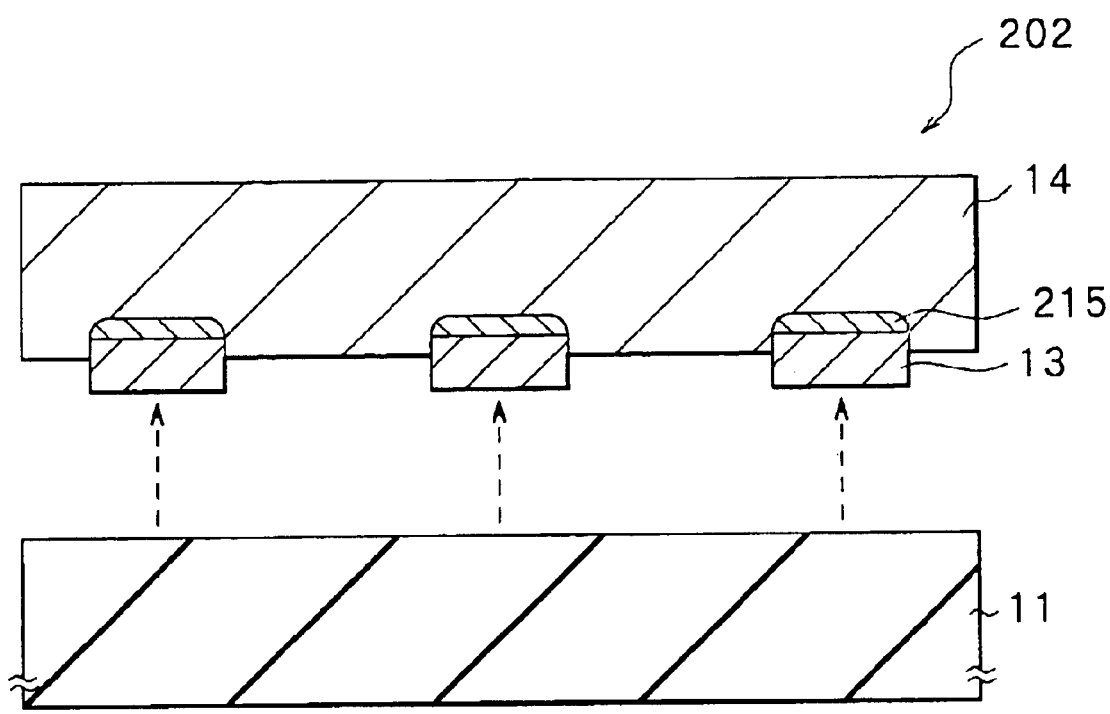
FIG. 17 is a cross sectional view of the semiconductor laminated substrate shown in FIG. 14 isolated by the separating layer.

The semiconductor laminated substrate 201 is used in the same manner as the first embodiment. FIG. 17 shows the semiconductor laminated substrate 201 isolated by the separating layer 12. As shown in this drawing, also in the case of the semiconductor laminated substrate 201, the base substrate 11 is isolated by etching the separating layer 12 in the same manner as the first embodiment. In this case, the buffer layer 13 may be etched together with the separating layer 12 depending on the material constituting the buffer layer 13. The semiconductor crystal layer 14 isolated from the base substrate 11 is used as a semiconductor crystal substrate 202 in the same manner as the first embodiment. For example, similarly to the first embodiment, the semiconductor crystal substrate 202 has the protrusions, which are provided by the protruding buffer layers 13 distributed in the form of lines or islands, on one surface of the semiconductor crystal layer 14 having a pair of facing surfaces. Also, the semiconductor crystal substrate 202 has the anti-growing film 215 on a part between the semiconductor crystal layer 14 and the buffer layer 13. Although not shown, when the buffer layer 13 is dissolved together with the separating layer 12, the semiconductor crystal substrate 202 has the depressions, which are distributed in the form of lines or islands corresponding to the dissolved buffer layers 13 and anti-growing film 215, on one surface of the semiconductor crystal layer 14 having a pair of facing surfaces.

The semiconductor laminated substrate 201 according to this embodiment has the same structure as the first embodiment except that the anti-growing film 215 is formed on the sides of the separating layer 12, a part of the sides of the buffer layer 13 and at least a part of the upper surface of the buffer layer 13. In addition to the effect of the first embodiment, it is therefore possible to prevent the through dislocation M from the buffer layer 13 from propagating through the semiconductor crystal layer 14 and to thus reduce the defects in the semiconductor crystal layer 14. Therefore, the semiconductor device is formed by using the semiconductor laminated substrate 201 and the semiconductor crystal substrate 202, whereby the semiconductor device having few defects and high properties can be obtained.

Although the invention has been described above with reference to the embodiments, the invention is not limited to the above-described embodiments and various modifications and changes of the invention are possible. For example, although the separating layer 12 is formed directly on the base substrate 11 in the above-described embodiments, any other semiconductor layer may be inserted between the base substrate 11 and the separating layer 12. For example, a first underlying layer composed of GaN of a nearly amorphous microcrystal grown at low temperature is formed on the base substrate 11, then a second underlying layer composed of GaN grown at high temperature is formed on the first underlying layer, and then the separating layer 12 is formed on the second underlying layer.

Although the buffer layers 13 are distributed in the form of lines or islands similarly to the separating layers 12 in the above-described embodiments, the buffer layers may or may not be formed like a plate similarly to the semiconductor crystal layers 14 and 114. In this case, for example, the separating layer 12 is thickly formed, or the underlying layers and so on are formed between the separating layer 12 and the base substrate 11 as mentioned above and the underlying layers are distributed in the form of lines or islands similarly to the separating layers 12, whereby the sectional area of the flow-through hole 16 can be sufficiently increased.

Although the separating layer 12 has a function of the core for growing the buffer layer 13 in the above-described embodiments, it is not necessary for the separating layer 12 to have such a function.

Although the invention has been described by referring to specific structures in the above-described embodiments, any other structure is embraced by the invention as long as it has the flow-through hole 16 for flowing therethrough the etchant for etching the separating layer 12. Moreover, although the material constituting each element has been described by taking specific examples, the invention is also broadly applied to the structure having the separating layer 12 composed of any other material, the semiconductor crystal layer 14 composed of any other semiconductor material or each element composed of any other material.

Although the semiconductor layer for forming the separating layer 12, the buffer layer 13, the semiconductor crystal layers 14 and 114 and the element structure is formed by MOCVD in the above-described embodiments, the semiconductor layer may undergo epitaxy by any other vapor deposition such as MBE (Molecular Beam Epitaxy), MOMBE (Metal Organic Molecular Beam Epitaxy) or halide. Halide vapor deposition means the vapor deposition in which halogen contributes to transport or reaction, and the halide vapor deposition is sometimes referred to as hydride vapor deposition.

Although the structure of the semiconductor device has been specifically described in the above-mentioned embodiments, the structure may have the element whose type is reversed, any other semiconductor material or any other structure, for example. The invention is broadly applicable to the optical element, the field effect element, the bipolar electronic element or the photoelectronic element including at least two or more of these elements.

As described above, according to the semiconductor laminated substrate of the invention, the semiconductor laminated substrate has the flow-through hole for flowing therethrough the etchant for etching the separating layer. Thus, the separating layer can be easily etched and thus the base substrate can be easily isolated. Therefore, the semiconductor device is formed by using the semiconductor laminated substrate, whereby the following effect is achieved. That is, the cleavage can be employed, the electrodes do not have to be removed from the same side, and the heat radiation properties can be improved.

According to the semiconductor laminated substrate, the flow-through hole is formed in at least a part of the side of the separating layer sandwiching the anti-growing film. This achieves the effect that it is possible to prevent the semiconductor crystal layer from growing on the sides of the separating layer and to thus easily form the flow-through hole. Moreover, the following effect is achieved. That is, the width of the separating layer that must be etched can be reduced, the separating layer can be easily etched and the time required for the etching can be reduced.

According to the semiconductor laminated substrate, the flow-through hole is formed in at least a part of the side of the buffer layer sandwiching the anti-growing film. Thus, the sectional area of the flow-through hole can be sufficiently increased and thus the etchant can easily flow through the flow-through hole. In other words, the effect that the separating layer can be easily etched is achieved.

According to the semiconductor laminated substrate, the anti-growing film is formed on a part between the buffer layer and the semiconductor crystal layer. Thus, it is possible to prevent the through dislocation from the buffer layer from propagating through the to semiconductor crystal layer and to thus reduce the defects in the semiconductor crystal layer. Therefore, the semiconductor device is formed by using the semiconductor laminated substrate, whereby the following effect is achieved. That is, the semiconductor device having few defects and high properties can be obtained.

According to the semiconductor crystal substrate of the invention, the semiconductor crystal substrate has the protrusions or the depressions on one of the facing surfaces. Therefore, the semiconductor device is formed by using the semiconductor crystal substrate, whereby the following effect is achieved. That is, the cleavage can be employed, the electrodes do not have to be removed from the same side, and the heat radiation properties can be improved.

According to the semiconductor device of the invention, the semiconductor device comprises the semiconductor laminated substrate of the invention or the semiconductor crystal substrate of the invention. Therefore, the following effect is achieved. That is, the cleavage can be employed, the electrodes do not have to be removed from the same side, and the heat radiation properties can be improved.

In addition, according to the method of manufacturing the semiconductor laminated substrate of the invention, the method comprises the step of forming the flow-through hole. According to the method of manufacturing the semiconductor crystal substrate of the invention, the method comprises the step of isolating the semiconductor laminated substrate of the invention by the separating layer. According to the method of manufacturing the semiconductor device of the invention, the method uses the semiconductor laminated substrate of the invention or the semiconductor crystal substrate of the invention. Therefore, the following effect is achieved. That is, the semiconductor laminated substrate, the semiconductor crystal substrate or the semiconductor device of the invention can be easily manufactured and thus easily realized.

Obviously many modifications and variations of the present invention are possible in the light of the above teachings. It is therefore to be understood that within the scope of the appended claims the invention may be practiced otherwise than as specifically described.

What is claimed is:

1. A semiconductor laminated substrate comprising a substantially continuous and uninterrupted base substrate and a substantially continuous and uninterrupted semiconductor crystal layer formed on the base substrate sandwiching an intermittent separating layer having flow-through hole for flowing therethrough an etchant for etching the separating layer.

2. A semiconductor laminated substrate according to claim 1, wherein the base substrate is made of sapphire, silicon, spinel, neodymium gallate, lithium gallate, lithium aluminate or silicon oxide.

3. A semiconductor laminated substrate according to claim 1, wherein the separating layer is distributed in the form of lines or islands.

4. A semiconductor laminated substrate having a base substrate and a semiconductor crystal layer formed on the base substrate sandwiching a separating layer, comprising a flow-though hole for flowing therethrough an etchant for etching the separating layer, wherein the semiconductor crystal layer comprises a III–V nitride semiconductor containing at least one kind of element in a group of III elements consisting of gallium (Ga), aluminum (Al), boron (B) ad indium (In) and at least nitrogen in a group of V elements consisting of nitrogen (N), phosphorus (P) and arsenic (As), and wherein the separating layer comprises at least either a III–V compound semiconductor containing at least one kind of element in the group of III elements and at least one kind of element in the group of V elements or a II–VI compound semiconductor containing at least one kind of element in a group of II elements consisting of zinc (Zn), magnesium (Mg), beryllium (Be), cadmium (Cd), manganese (Mn) and mercury (Hg) and at least one kind of element in a group of VI elements consisting of oxygen (O), sulfur (S), selenium (Se) and tellurium (Te).

5. A semiconductor laminated substrate having a base substrate and a semiconductor crystal layer formed on the base substrate sandwiching a separating layer, comprising a flow-through hole for flowing therethrough an etchant for etching the separating layer, wherein the flow-through hole is provided in at least a part of a side of the separating layer sandwiching an anti-growing film.

6. A semiconductor laminated substrate according to claim 5, wherein the anti-glowing film is made of at least one of silicon oxide, silicon nitride, aluminum oxide, tungsten and molybdenum.

7. A semiconductor laminated substrate having a base substrate and a semiconductor crystal layer formed on the base substrate sandwiching a separating layer comprising:
   a flow-through hole for flowing therethrough an etchant for etching the separating layer;
   a buffer layer formed between the separating layer and the semiconductor crystal layer.

8. A semiconductor laminated substrate according to claim 7, wherein the buffer layer comprises the III–V compound semiconductor containing at least one kind of element in the group of III elements and at least one kind of element in the group of V elements.

9. A semiconductor laminated substrate according to claim 7, wherein the flow-through hole is provided in at least a part of the side of the buffer layer sandwiching the anti-growing film.

10. A semiconductor laminated substrate according to claim 7, further comprising:
   an anti-growing film formed on a part between the buffer layer and the semiconductor crystal layer.

11. A semiconductor laminated substrate having a pair of facing surfaces comprising:
   protrusions or depressions on one of the facing surfaces; and
   a semiconductor crystal layer composed of a III–V nitride semiconductor containing at least one kind of element in a group of III elements consisting of gallium (Ga), aluminum (Al), boron (B) and indium (In) and at least nitrogen in a group of V elements consisting of nitrogen (N), phosphorus (P) and arsenic (As).

12. A semiconductor laminated substrate having a pair of facing surfaces comprising:
   protrusions or depressions on one of the facing surfaces;
   a semiconductor crystal layer having a pair of facing surfaces;
   a protruding buffer layer provided on one of the facing surfaces of the semiconductor crystal layer; and
   an anti-growing film provided on a part between the buffer layer and the semiconductor crystal layer.

13. A semiconductor device comprising a semiconductor laminated substrate having a boreless base substrate and a boreless semiconductor crystal layer formed on the base substrate sandwiching a separating layer, wherein the semiconductor laminated substrate has a flow-through hole for flowing therethrough an etchant for etching the separating layer.

14. A semiconductor device according to claim 13, comprising:
   an optical element, a field effect element, a bipolar electronic element or a photoelectronic element including at least two of these elements.

15. A semiconductor device comprising a semiconductor laminated substrate having a base substrate and a semiconductor crystal layer formed on the base substrate sandwiching a separating layer, wherein the semiconductor laminated substrate has a flow-through hole for flowing therethrough an etchant for etching the separating layer, and wherein the flow-through hole is provided in at least a part of the side of the separating layer sandwiching an anti-growing film.

16. A semiconductor device comprising a semiconductor laminated substrate having a base substrate and a semiconductor crystal layer formed on the base substrate sandwiching a separating layer, wherein the semiconductor laminated substrate has a flow-through hole for flowing therethrough an etchant for etching the separating layer, and wherein the semiconductor laminated substrate further comprise a buffer layer provided between the separating layer and the semiconductor crystal layer.

17. A semiconductor device according to claim 16, wherein the semiconductor laminated substrate has the flow-through hole provided in at least a part of the side of the buffer layer sandwiching the anti-growing film.

18. A semiconductor device according to claim 16, wherein the semiconductor laminated substrate further comprises an anti-growing film provided on a part between the buffer layer and the semiconductor crystal layer.

19. A semiconductor device comprising a semiconductor crystal substrate having a pair of facing surfaces, wherein the semiconductor crystal substrate has protrusions or depressions on one of the facing surfaces, and wherein the semiconductor crystal substrate comprises a semiconductor crystal layer having a pair of facing surface, a protruding buffer layer provided on one of the facing surfaces of the semiconductor crystal layer, and an anti-growing film provided on a part between the buffer layer and the semiconductor crystal layer.

20. A semiconductor device according to claim 19 comprising:
   an optical element, a field effect element, a bipolar electronic element or a photoelectronic element including at least two of these elements.

* * * * *